United States Patent [19]

Feeney

[11] Patent Number: 5,467,609

[45] Date of Patent: * Nov. 21, 1995

[54] MODULAR FLOOR SUB-STRUCTURE FOR THE OPERATIONAL SUPPORT OF COMPUTER SYSTEMS

[75] Inventor: Edward K. Feeney, Worthington, Ohio

[73] Assignee: Liebert Corporation, Columbus, Ohio

[ * ] Notice: The portion of the term of this patent subsequent to Sep. 13, 2011, has been disclaimed.

[21] Appl. No.: 201,587

[22] Filed: Mar. 3, 1994

Related U.S. Application Data

[63] Continuation-in-part of Ser. No. 51,534, Apr. 23, 1993, Pat. No. 5,345,779.

[51] Int. Cl.⁶ .................................................. F25D 17/06
[52] U.S. Cl. ............................... 62/259.2; 52/220.2
[58] Field of Search ........................... 62/259.2, 265; 454/184, 186; 52/126.1, 220.2

[56] References Cited

U.S. PATENT DOCUMENTS

| | | | |
|---|---|---|---|
| 2,579,447 | 12/1951 | Boucher | 52/126.1 |
| 3,007,212 | 11/1961 | Gazin | 52/126.1 |
| 3,348,345 | 10/1967 | Byers et al. | 52/126.1 |
| 3,643,389 | 2/1972 | Sheppley | 52/220.2 |
| 4,368,869 | 1/1983 | Gelvezon et al. | 248/656 |
| 4,558,544 | 12/1985 | Albrecht et al. | 52/126.2 |
| 4,862,654 | 9/1989 | Macias | 52/126.1 |
| 5,345,779 | 9/1994 | Feeney | 62/259.2 |

Primary Examiner—Henry A. Bennet
Attorney, Agent, or Firm—Mueller and Smith

[57] ABSTRACT

A modular floor sub-structure is provided wherein discrete floor modules having bottom surfaces and sides extending upwardly to support paired floor tile are interconnected to sit upon a floor surface and, in turn, support rack-mounted computer components. Select ones of the floor modules contain air cooling coils and blowers, while others are provided with uninterrupted power supplies and still others retain power distribution networks. The cooling system of a given module as well as the UPS components of another given module are provided having a capacity for supporting one computer component. Where more than one computer component is to be supported by the system, then additional modules are provided to develop an expanded elevated floor surface with power and heat removal servicing specific to each computer component. A step arrangement is provided, the interior of which is utilized to retain flexible chilled water conduits for servicing the cooling coils within adjacently disposed floor modules as well as for providing servicing access to the cooling coils, thh UPS system and a poer distribution console. The step structure pivots from a seated to an open position to provide service access.

26 Claims, 11 Drawing Sheets

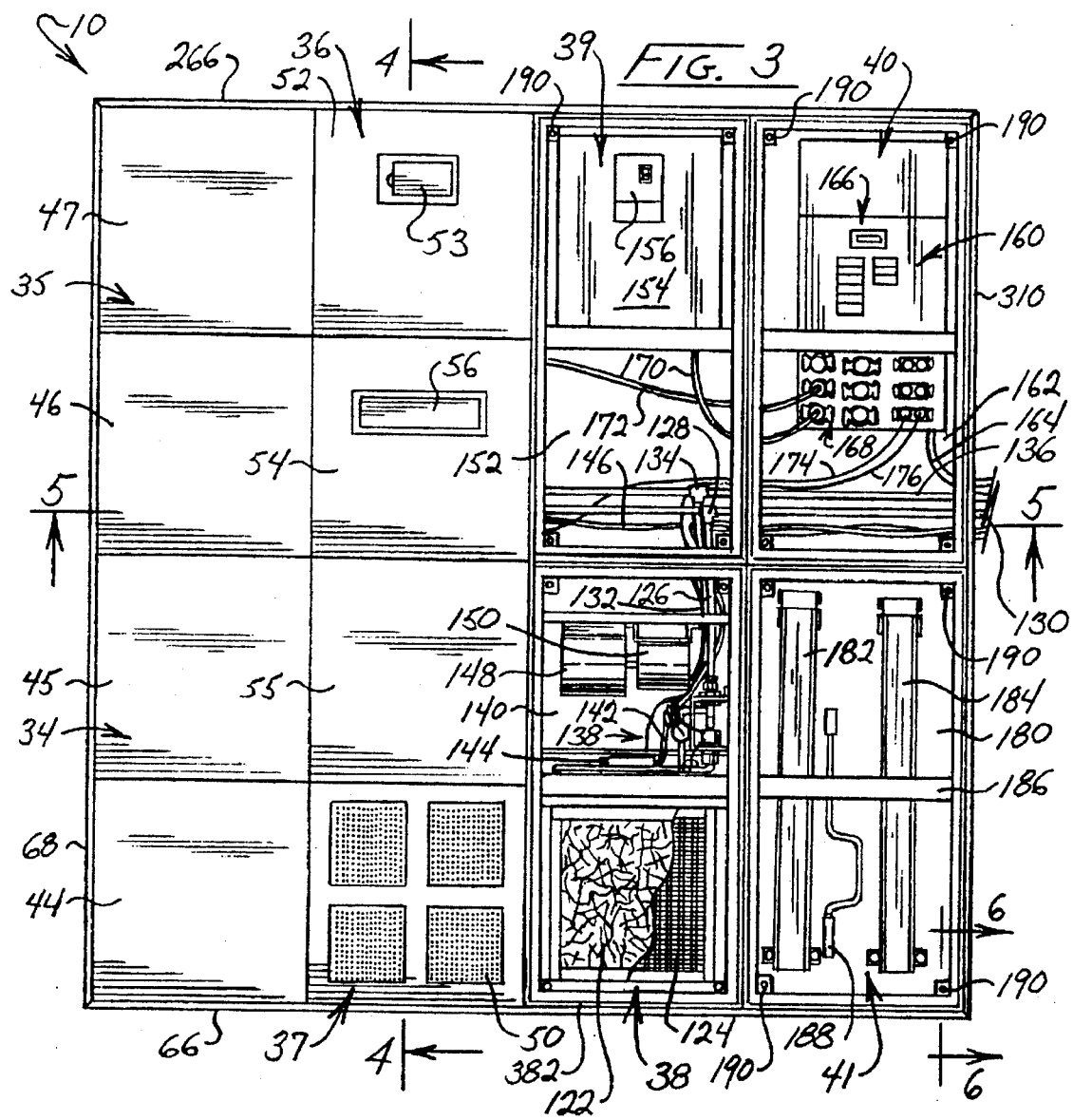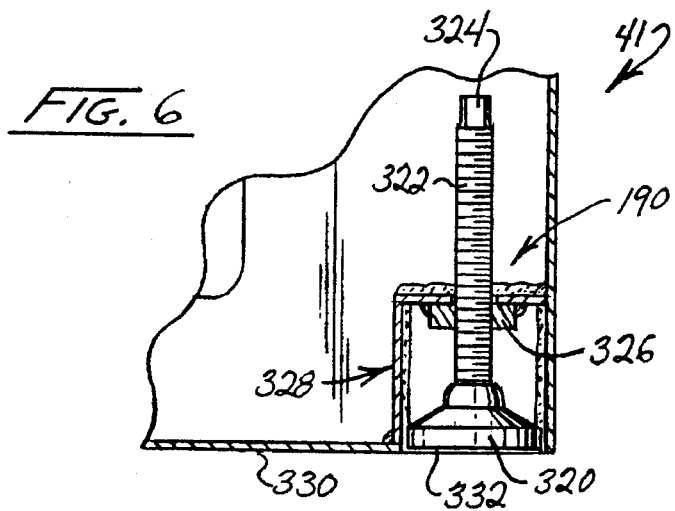

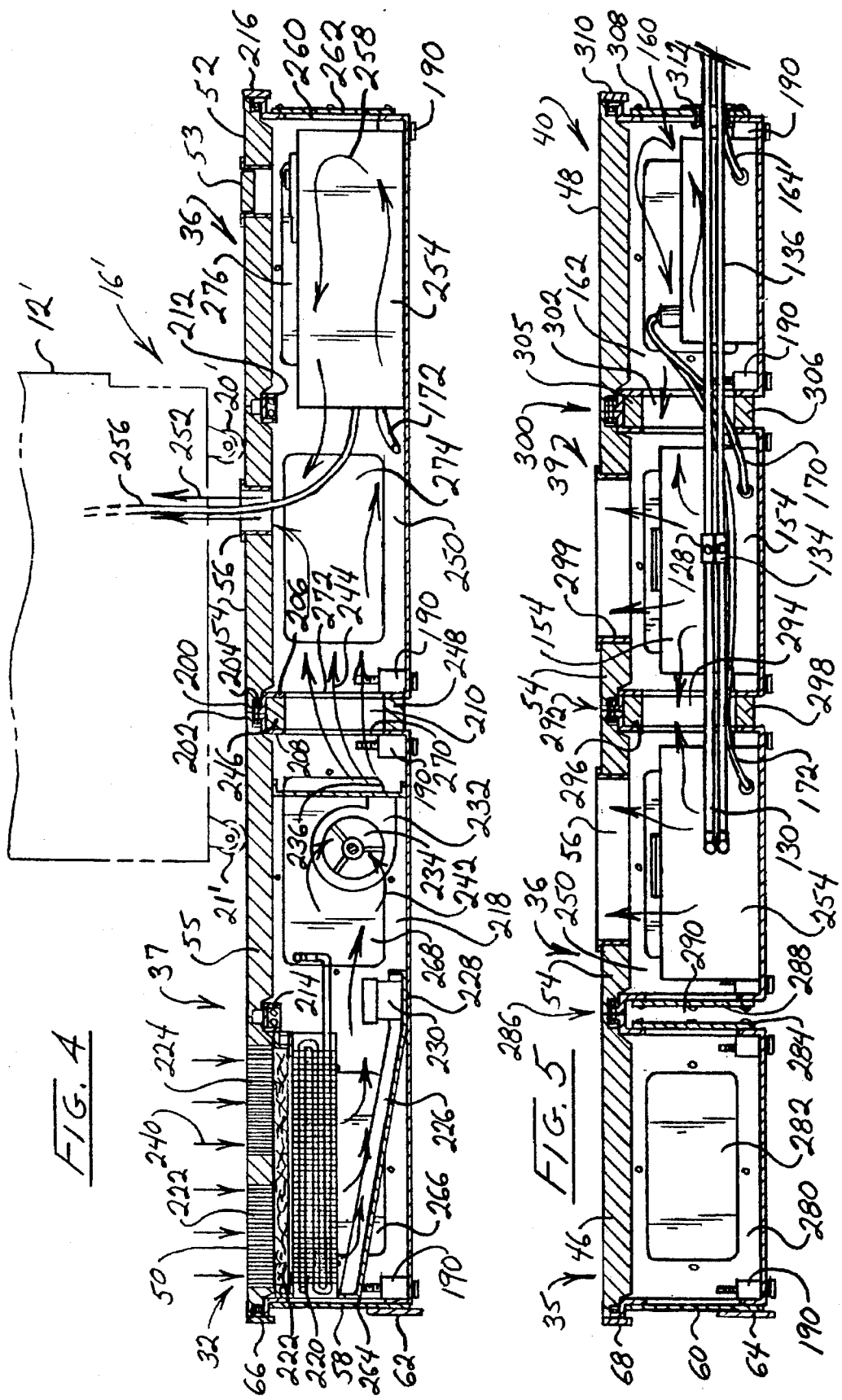

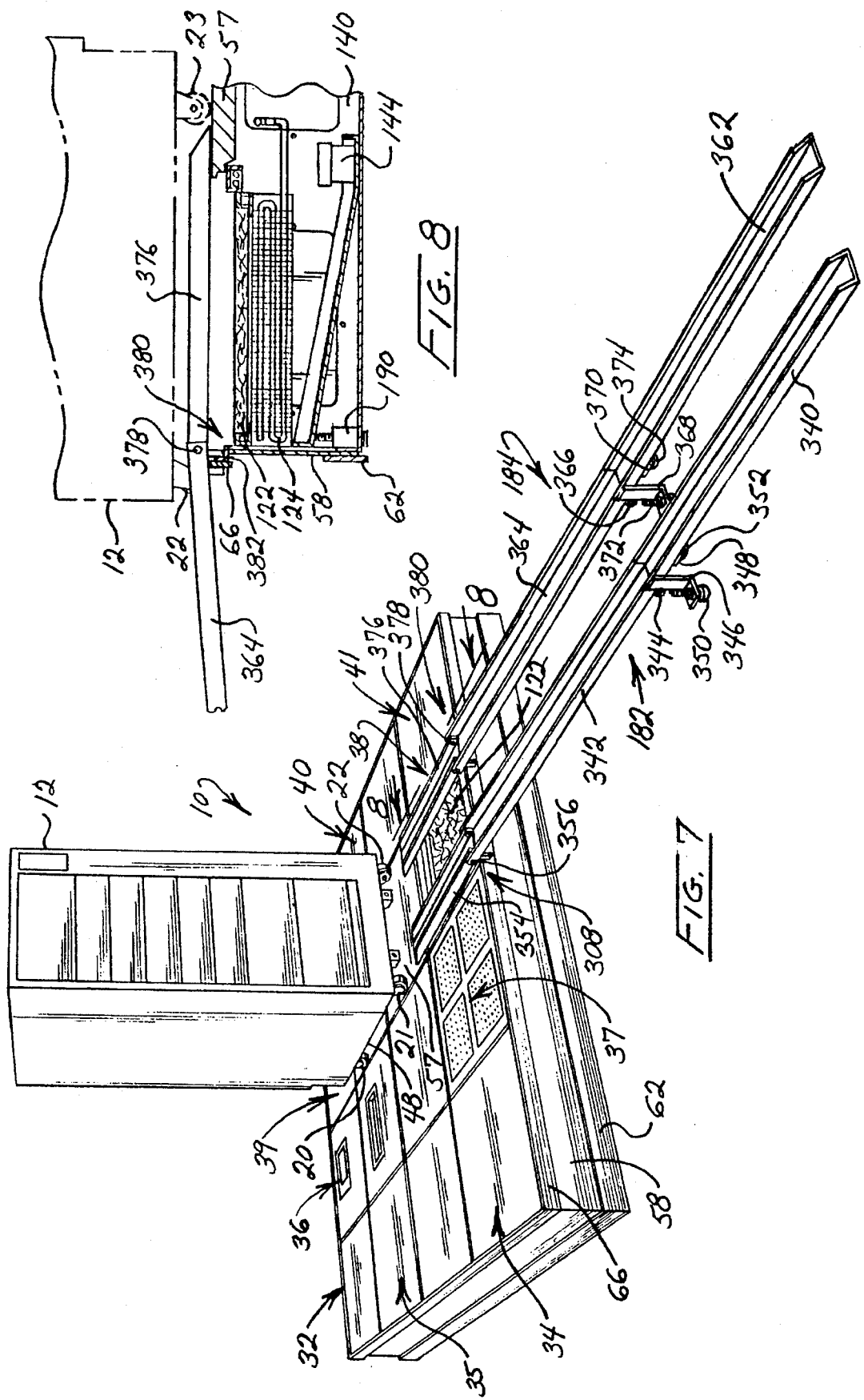

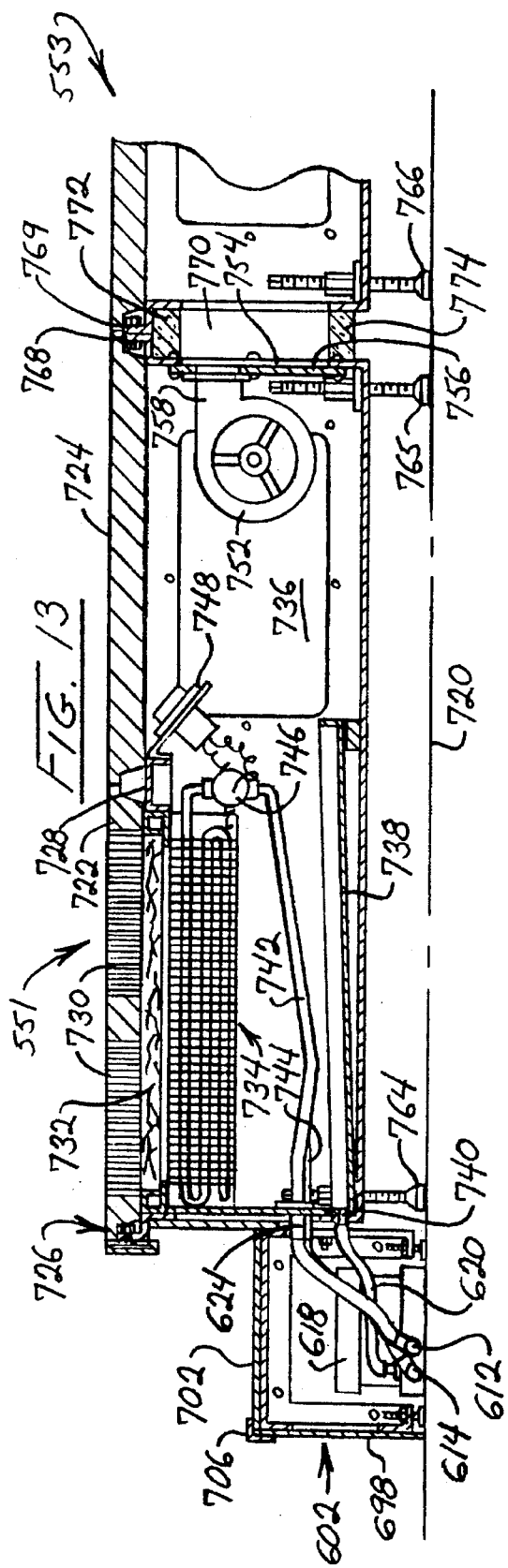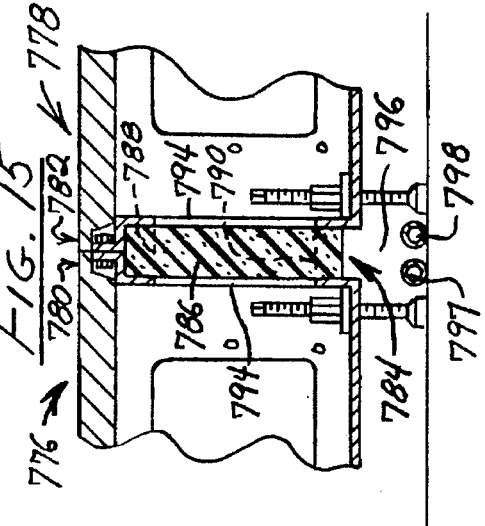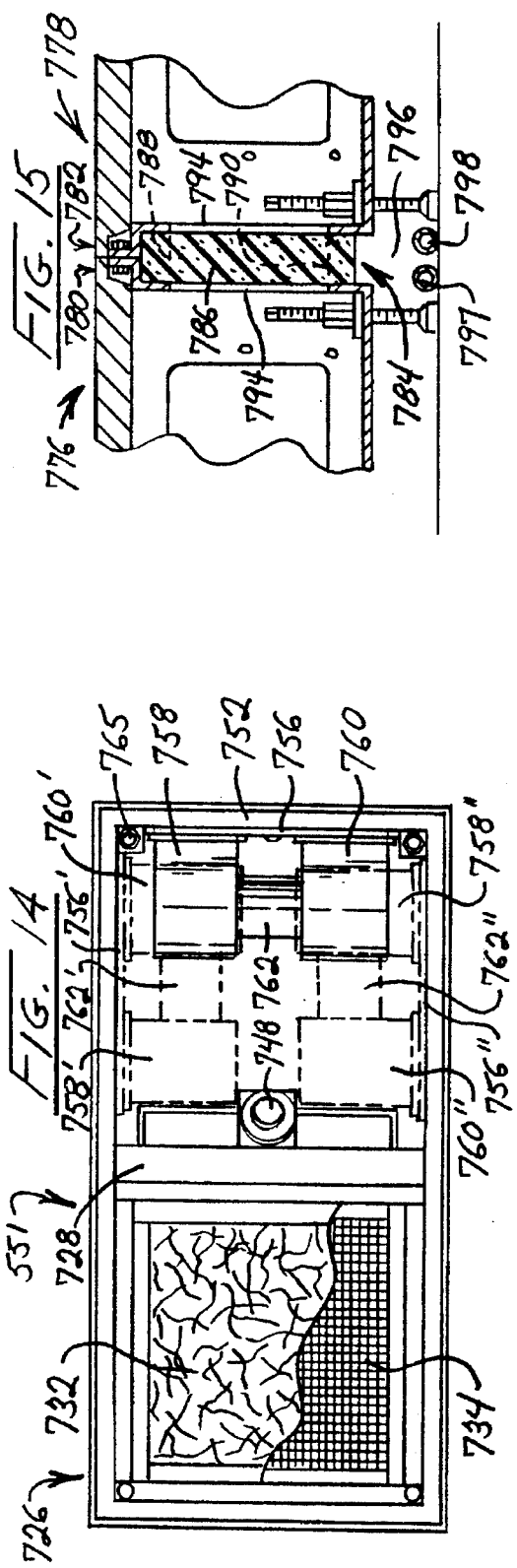

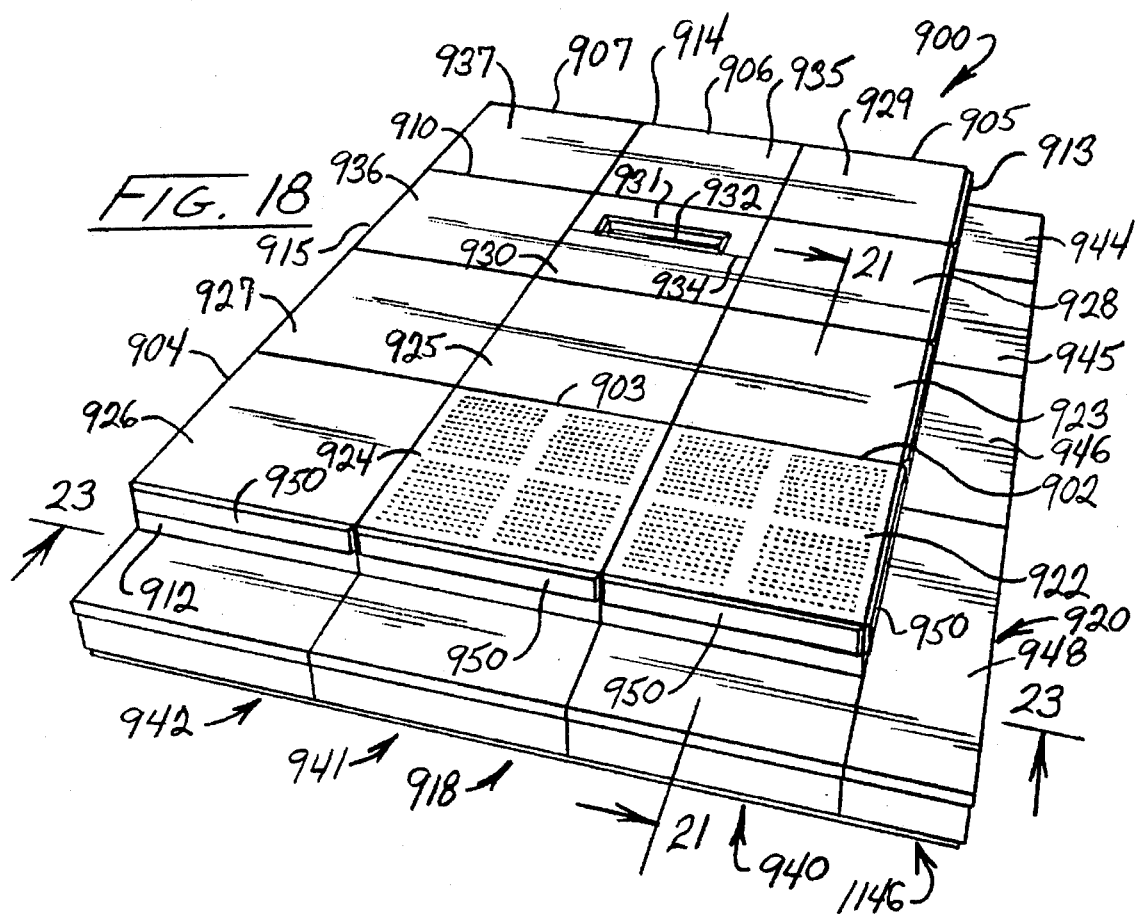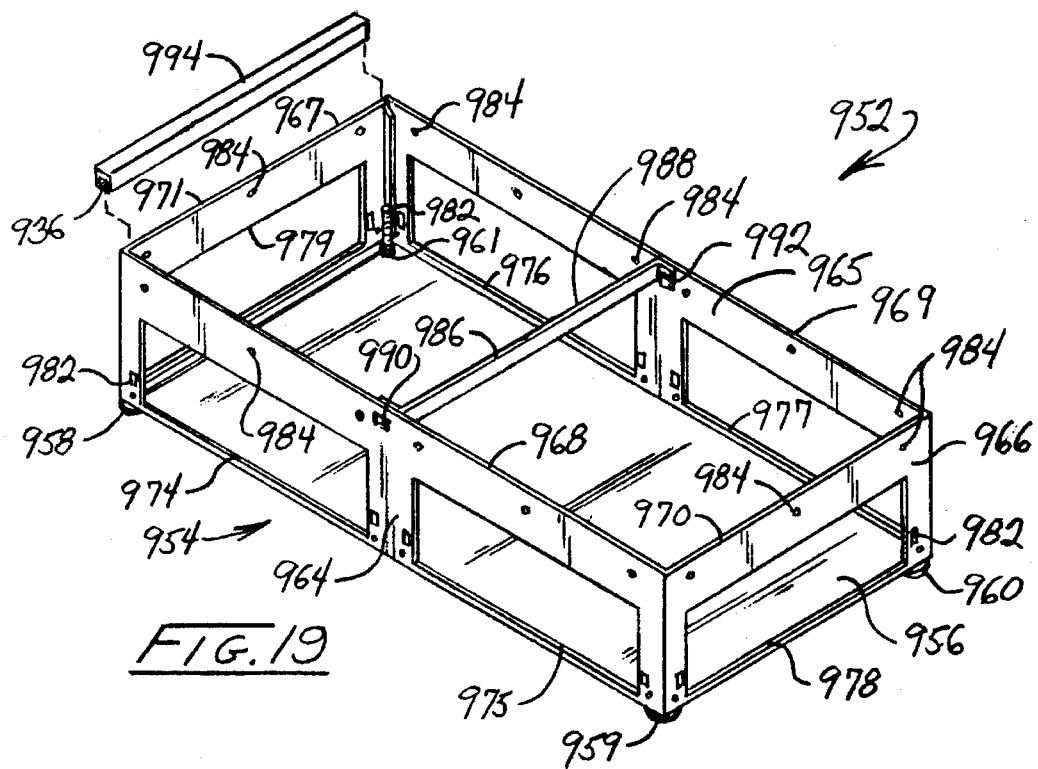

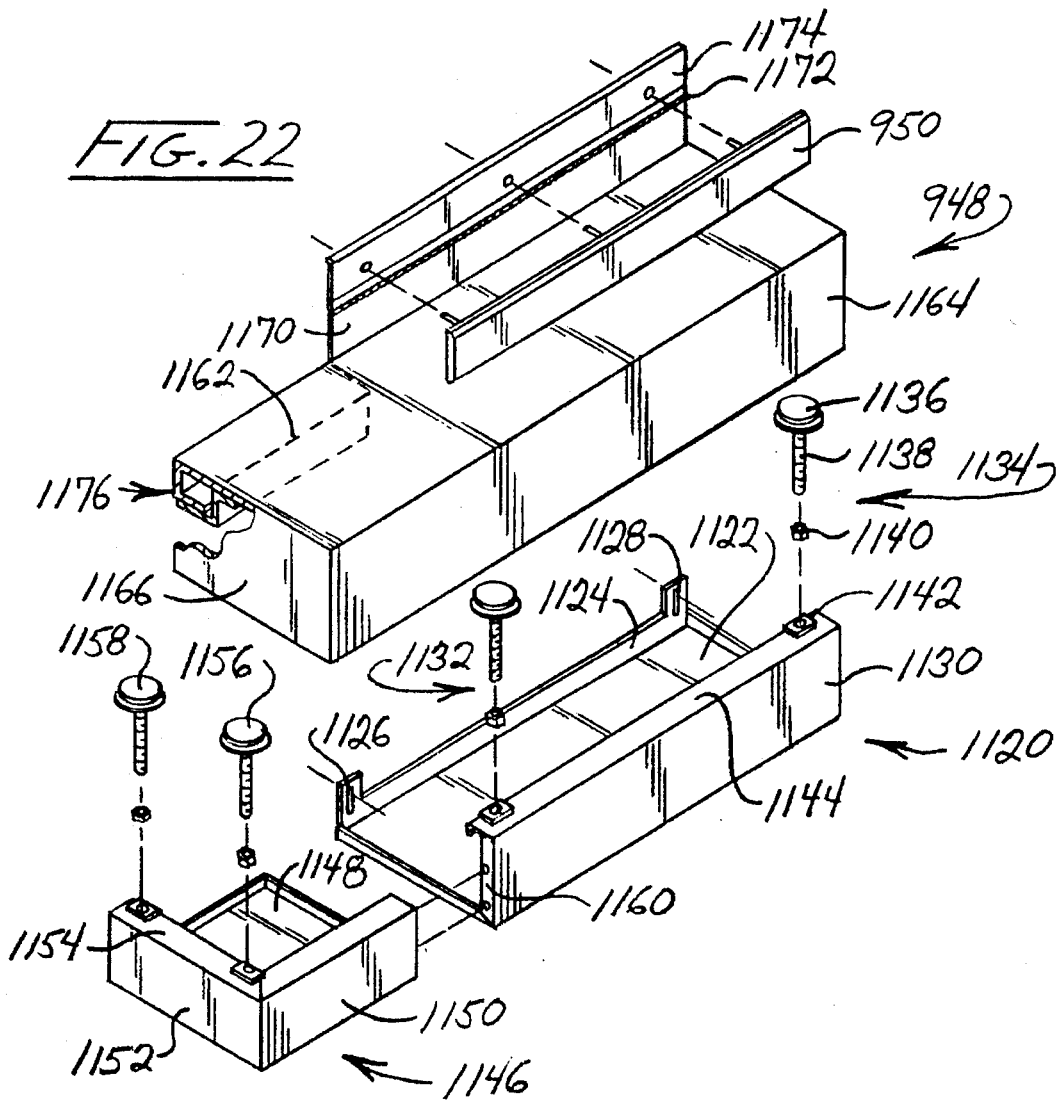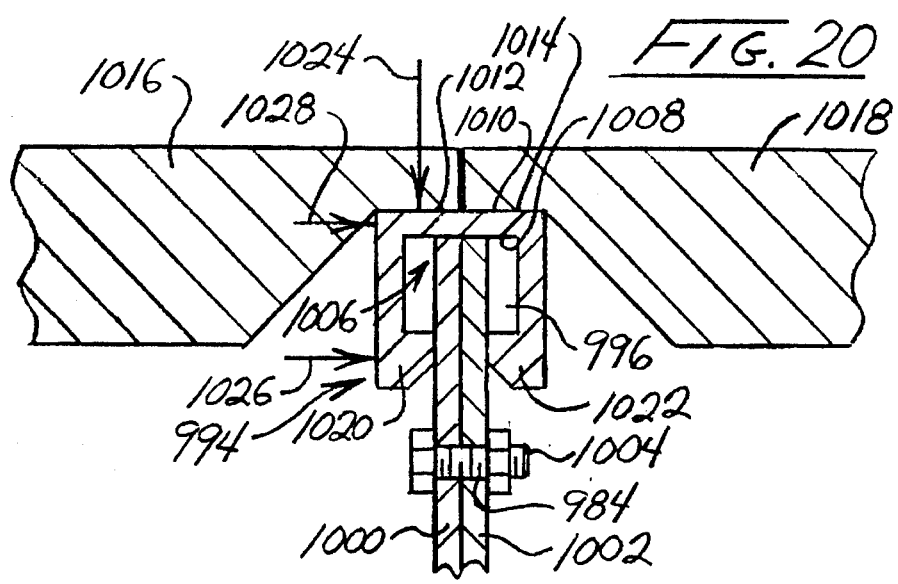

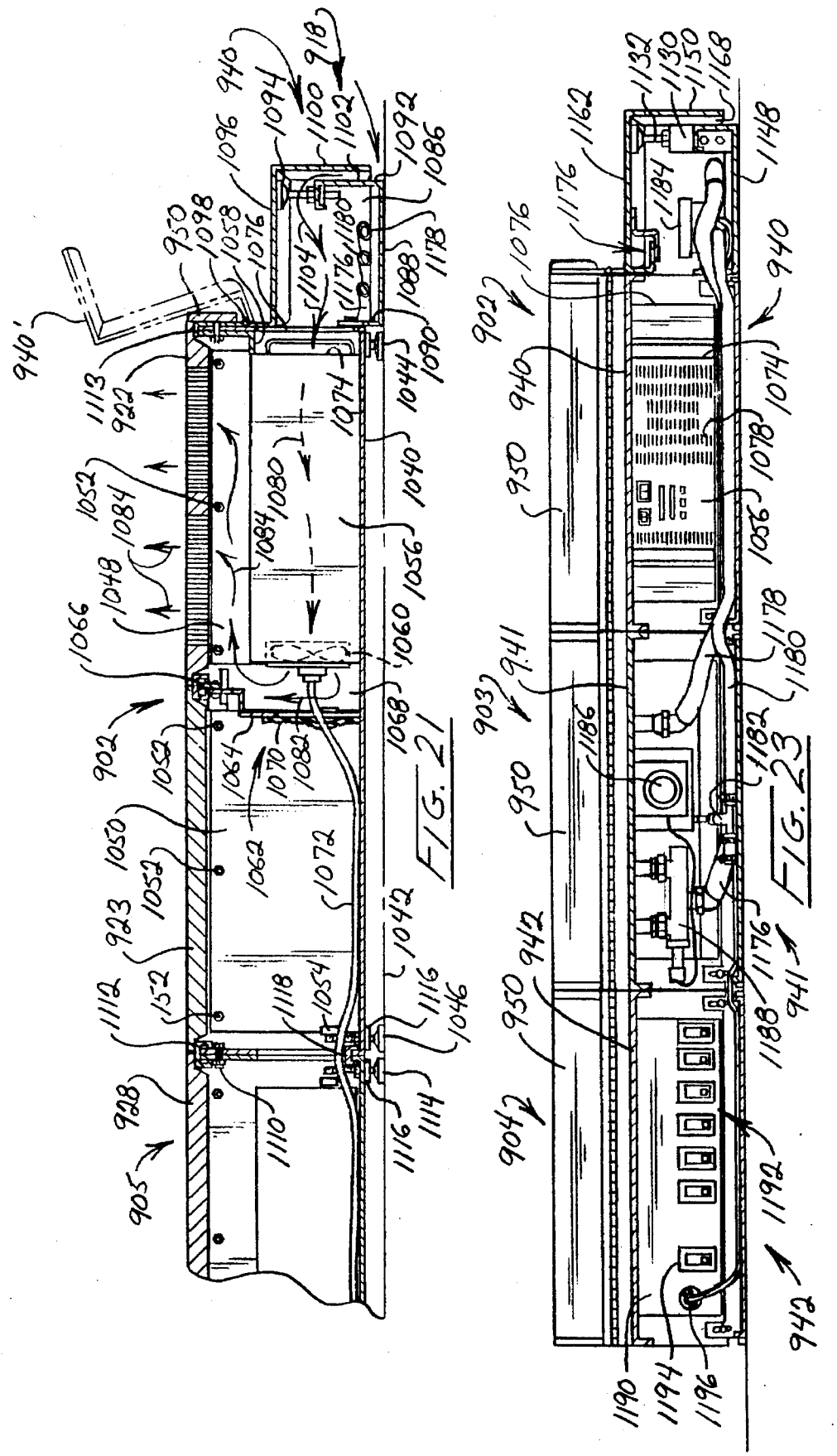

MODULAR FLOOR SUB-STRUCTURE FOR THE OPERATIONAL SUPPORT OF COMPUTER SYSTEMS

CROSS REFERENCE TO RELATED APPLICATIONS

The present application is a continuation-in-part of application for U.S. patent Ser. No. 08/051,534 by Edward K. Feeney, filed Apr. 23, 1993, titled "Modular Floor Sub-Structure for the Operational Support of Computer Systems", and assigned in common, now U.S. Pat. No. 5,345,779, issued Sep. 13, 1994.

BACKGROUND OF THE INVENTION

Traditionally, industrial data centers have been designed to accommodate relatively large "mainframe" computer systems. These systems include stand-alone hinged cabinet contained control processing units, tape guide systems, disk drives, printers, control consoles, and the like. When assembled within a data center, the systems have required a relatively larger amount of floor area within a given building, as well as a carefully controlled environment. Control over that environment requires a dedicated, sealed computer room which is serviced by corresponding dedicated air-conditioning systems. In similar fashion, critical equipment within the room is serviced by dedicated uninterruptible power supplies. Because of the extensive amount of electrical interconnection required both for power supply and system communication, these computer rooms typically contain raised floors formed of tiles supported upon frames beneath which the complex cable networks can be laid. Generally, the provision of such computer rooms has represented a substantial financial investment on the part of the user.

Over the recent past, the computer industry has introduced processing systems employing more modem, modular electronics and supporting components permitting their rack mounted installation. Such modularized designs provide for substantial flexibility in accommodating for varying processing demands. For example, these systems readily are expanded incrementally as the growth of processing needs on the part of the user increases. As a consequence of improved design, such systems exhibit lower heat loads, lower noise output, and a compactness in packaging such that they are promoted for installation within the environment of a business office as opposed to a data center. One such system, for example, is identified under the trademark "AS/400", marketed by International Business Machines Corporation. This system offers a family of processor related modular units generally employing rack-mounted packaging. Cabinetry carrying the rack mounted modules will, for example, have nominal dimensions of 26 inches width by 36 inches depth, and 62 inches height. To facilitate their delivery to an intended operating location, they are supported for movement upon casters. With the racks fully loaded, the equipment may, for example, exhibit a heat load of 11,000 BTUs per hour, representing a demand for about one ton of air-conditioning. Similarly, the units will call for an uninterrupted power supply load capacity of about 3 KVA. These requirements, particularly when more than one component of a system is utilized (a typical case) generally cannot be accommodated by the in-place air-conditioning system of a building nor its in-place power capabilities. Thus, the user is called upon to find a technique of buttressing air-conditioning capacities, as well as power feeder inputs. Additionally, to accommodate for anticipated growth increments in such systems, in keeping with that aspect of the system design, the user must anticipate future air-conditioning needs, as well as future uninterruptible power supply needs. The result, in general, has been a resort on the part of the user to a conventional sealed computer room, an approach which essentially compromises many of the advantages of this modular form of processing system. Such computer room installations further may be called for where the office facilities within which the systems are installed are leased. Very often, the owners of such leased facilities will substantially shut-down building air-conditioning systems over weekends and the like much to the detriment of the data center. Thus, a dedicated environment is necessitated. Further, where computer rooms are installed within leased facilities, those dedicated rooms become fixtures and, without agreement otherwise, cannot be dismantled and transported to a new installation site.

As is apparent, the full advantage and flexibility of these newer modular computer systems can be recognized only when a corresponding flexible, modular support of their environmental and power input demands can be achieved on a practical cost basis.

SUMMARY

The present invention is addressed to a floor supported sub-structure system and module assemblage serving to operationally support computer system components, particularly of the incrementally expandable, rack mounted variety. Floor sub-structure assemblages of the invention are formed of interconnected, uniformly dimensioned floor modules, each with a frame with sides extending from a bottom surface to an upper portion or edge. This edge supports an upwardly disposed support surface. Two square floor tiles are carded at the upwardly disposed support surface by each module such that each defines an internal chamber. The internal chamber of select ones of the floor module chambers contain modular operational support devices for dedicated use by corresponding computer components. In this regard, air cooling coils and associated motor driven blower fans are installed in certain of the floor modules. The cooling coils within those modules are designed to accommodate the heat load of one computer component. Because of the restrictive region of cool air flow utilized within the modular assemblage, and the lower heat loads involved with this form of computer component, these coils may be designed to avoid vapor condensation for most installations. Uninterruptible power supply (UPS) devices are positioned with the confines of the internal cavities of other select floor modules. These UPS devices are provided with a limited power capacity which is dedicated to the requirements of an associated computer component. Still others of the floor modules are formed having a power distribution network mounted therein. These networks are designed, for example, to provide circuit breaker protected inputs for, for example, up to five UPS devices, or a computer component where those devices are not utilized. The networks also provide a source of power for a corresponding five blower fan motors and any associated condensation collection pumps.

Interconnection between adjacent floor modules is by bolting together adjacent upwardly disposed regions of side portions of the modules. Leveling of the modules is carded out through the use of floor engaging foot structures which, in one embodiment permitting very low elevated floor heights provides a capability for retracting these foot modules entirely within the cavities of the modules themselves. For the latter embodiment, elevated floor heights as low as, for example, about 10 inches are achievable. To direct air flow from the blower structures to outlets within other modules directed into the lower regions of the computer system components, panel openings are formed within the sides of the modules. These panel openings may be selectively blocked to define air flow paths.

In another embodiment of the invention, the modules are formed with floor engaging foot structures extending below the bottom surface thereof and which are not retractable to the discrete cavities of each such module. This results in a cost benefit but a slightly higher elevated floor surface. Preferably utilized with the module assemblage is a step structure surrounding one or more sides of an assemblage of modules. By positioning those modules carrying cooling coils adjacent such outer side of the assemblage, the interior of the modular step structures can be employed to retain conduits carrying cooling fluids as well as any collected condensate from coils. This provides an advantageous separation of power distribution cabling from the conduits carrying fluid. In general, the conduits for carrying cooling water and the cabling for electrical distribution may be mounted, through the panel openings within the sides of the modules.

In a preferred embodiment of the invention, a step structure is utilized along a linear portion of an assemblage of the floor modules. This step structure includes the noted step cavity for carrying cooling conduits but additionally has a step defining structure. The step defining structure is pivotally movable between a seated position and an open position to gain access to the side of the floor module to which it is attached. These floor modules are the active ones including the cooling coil with exposed and now accessible thermostat and couplings for movement of coolant fluid; the active accessible components of a power distribution network such as circuit breakers; and the readouts and manual input controls of an uninterruptible power supply. Access to these components now becomes quite facile to service personnel.

In another preferred arrangement of the invention, that floor module which incorporates an uninterruptible power supply which is located adjacent the noted step structure employs a UPS arrangement incorporating a self-contained cooling fan. Then, the floor module containing UPS device is structured such that the UPS system is self cooling and, in fact, its air flow path providing such cooling is isolated from the air flow path developed from the cooling coil containing floor module. With such an arrangement, should power be lost, then even though air circulation blower associated with the cooling coil is not working, the UPS system, now on battery power supply, will remain itself cooled pending orderly shut-down of the supported computer system. For this arrangement, the step structure is designed to provide an air transfer opening with an air transferability extent at least equivalent with the air input geometry of the UPS device.

Movement of the caster mounted computer system components on and off of the substructure is provided through the use of a ramp assembly formed of two folding ramps which may advantageously be stored within an empty floor module. Additionally, floor modules may be utilized to support an environmental confinement enclosure where the systems are employed in rigorous factory environments or where it is desired to employ a Halon based form of fire protection. By utilizing the restrictive enclosures, the amount of Halon required is held to an environmentally advantageous minimum.

The invention, accordingly, comprises the system and apparatus possessing the construction, combination of elements, and arrangement of parts which are exemplified in the following detailed disclosure.

For a fuller understanding of the nature and objects of the invention, reference should be made to the following detailed description taken in connection with the accompanying drawings.

BRIEF DESCRIPTION OF THE DRAWINGS

FIG. 3 is a plan view of the floor assembly shown in FIG. 1 with portions removed and broken away to reveal internal structure;

FIG. 4 is a sectional view taken through the plane 4—4 in FIG. 3;

FIG. 5 is a sectional view taken through the plane 5—5 shown in FIG. 3;

FIG. 6 is a partial sectional view taken through the plane 6—6 shown in FIG. 3;

FIG. 7 is a perspective view of the system of FIG. 1 showing employment of a ramp structure for moving computer system components to and from the floor module assemblage;

FIG. 8 is a partial sectional view taken through the plane 8—8 shown in FIG. 7;

FIG. 13 is a partial sectional view taken through the plane 13—13 shown in FIG. 11;

FIG. 14 is a top view of a floor module shown in FIG. 13 and additionally showing alternate blower fan orientations;

FIG. 15 is a partial sectional view of a floor module assemblage described in connection with FIG. 11 showing an alternate intermodule insert arrangement;

FIG. 18 is a pictorial representation of a system employing an assemblage of floor modules according to a preferred embodiment of the invention, incorporating a step structure with service personnel access features;

FIG. 19 is a perspective view of the frame components of a floor module as may be employed with the assemblage shown in FIG. 18;

FIG. 20 is a partial sectional view of a floor tile support arrangement employed with the frame components of FIG. 19;

FIG. 21 is a sectional view taken through the plane 21—21 shown in FIG. 18;

FIG. 22 is an exploded perspective view showing a step structure employed with the assemblage of FIG. 18; and FIG. 23 is a sectional view taken through the plane 23—23 in FIG. 18.

DETAILED DESCRIPTION OF THE INVENTION

Figure 1:
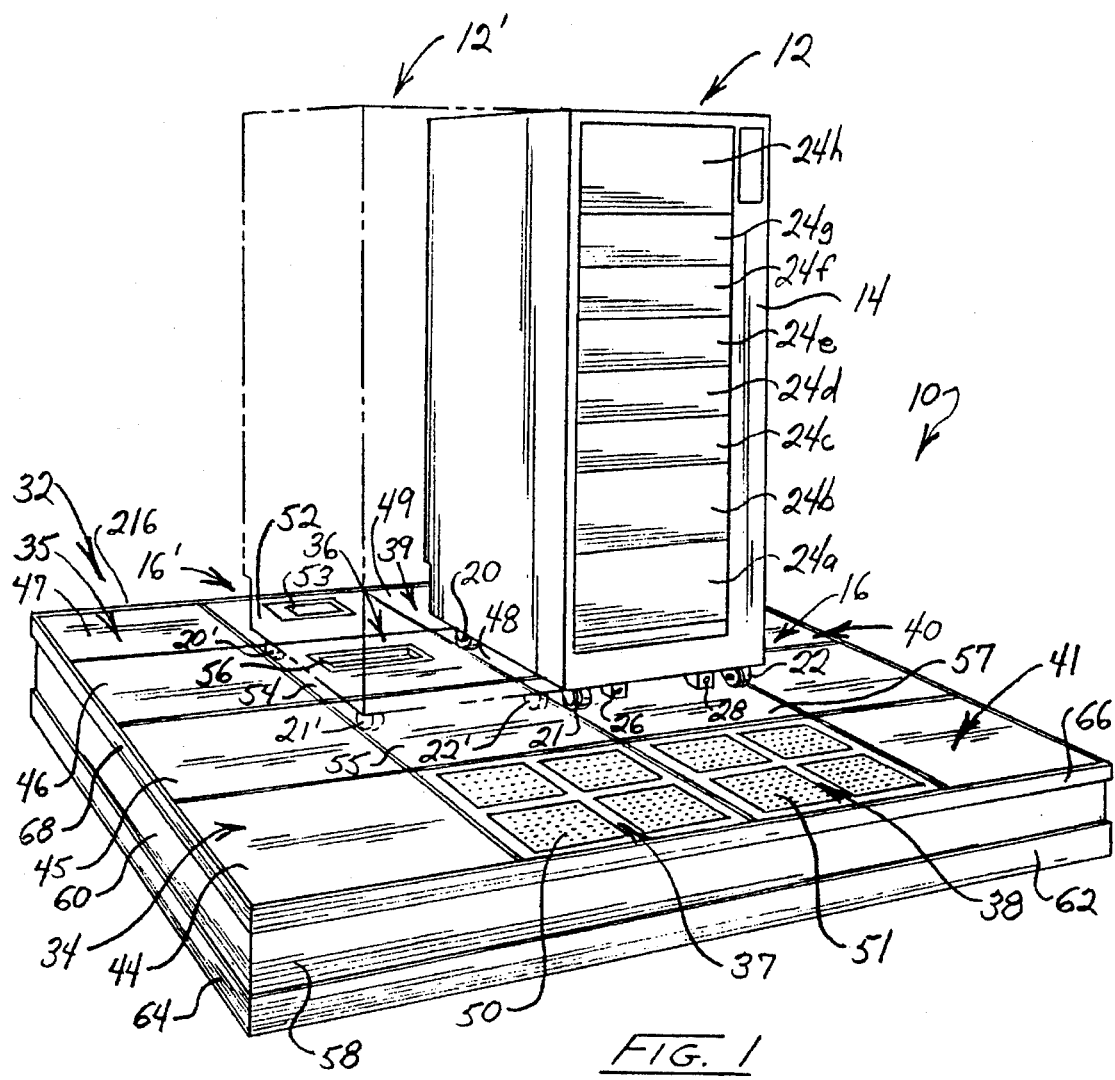
FIG. 1 is a pictorial representation of a system employing an assemblage of floor modules according to the invention and supporting two computer system components, one being shown in phantom to reveal floor structuring.

Referring to FIG. 1, the floor supported sub-structure system of the invention is revealed generally at 10. System 10 as depicted, represents a somewhat minimal configuration for use in the heat removal and power input support of a component of a computer system, for example, as represented at 12. Component 12 is of a rack mounted variety, having an upright housing 14 supported from a base region as represented generally at 16 which, in turn, is supported upon rolling wheels or casters at each corner thereof, three of which are represented at 20–22. Within the housing 14 are a sequence of pull-out racks 24a–24h which may be pulled out in the manner of a drawer by attending personnel. To avoid causing the component 12 to tilt forwardly when one or more racks 24a–24h are pulled out, an L-shaped forward brace (not shown) is attached to the housing 14 at brackets 26 and 28 following the positioning of housing 14 upon system 10. The base region 16 of the device 12 is rectangular and has a nominal dimension of 26 inches in width, 36 inches in depth, and 62 inches in height. For the arrangement shown, the system 10 is assembled to provide support to two adjacently disposed such components 12, the next adjacent component being represented in outline fashion and in phantom at 12' as being supported upon casters 20'-22' and having a base region 16'. Components 12 and 12' preferably perform in conjunction with an uninterruptible power supply (UPS) which, in turn, receives a utility power input from a feeder line and a distribution network which is circuit breaker protected. These devices may, for example, present a heat load of about 11,000 BTUs per hour to the environment within which they are operating.

System 10 permits the components 12 and 12' to be used as originally intended, i.e. within an office environment without requiring the revision of the air conditioning system thereof and without requiring the procurement of the UPS system having capacities anticipated for future expansion.

FIG. 1 reveals that components 12 and/or 12' are supported upon an elevated floor represented generally at 32 which is formed of an assemblage of eight floor modules seen in FIGS. 1 and 3 at 34–41. While each of the modules 34–41 is formed having a frame component of standardized dimension and shape, certain of them will contain conditioners for air such as chilled water cooling coils or the like which are mounted, for example in modules 37 and 38, as well as UPS systems as are located within modules 36 and 39 in the system of FIGS. 1 and 3. Each of the modules 34–40 is formed to support two rigid floor tiles which, for example, may be for a variety employed within conventional computer room false floors. Generally, these floor tiles will be 24 inches square in dimension. Two such floor tiles, for example those provided in conjunction with module 34, are seen at 44 and 45. Similar, contiguous tiles are provided in conjunction with modules 40 and 41. However, modules 37 and 38, in addition to conventional tiles 55 and 57, will be seen to contain such tiles as are shown at 50 and 51, each carrying a pattern of air entry holes or openings providing for an air input to the cooling coils immediately therebeneath. Floor modules 36 and 39, in addition to providing a portion of the support for respective components 12 and 12' also contain a compact uninterruptible power supply essentially encompassing about one-half of their lengthwise dimension. Accordingly, tiles such as that shown at 52 in the case of floor module 36 are configured having a door opening 53 which provides convenient access for the operator to observe UPS readouts such as status as to whether the devices are under battery drive or utility drive, and the current power load being imposed. The adjacent tile 54 within floor module 52 contains an air outlet 56 through which cooled air may flow into an appropriate base region of the computer component 12'. An identical arrangement is provided with respect to computer component 12 as provided from floor module 39. The outer exposed sides of the assemblage of system 10 are covered with a side panel or fascia, two of which are seen at 58 and 60 in FIG. 1. Additionally, extending up from the floor level for the exposed sides of the assemblage are polymeric baseboards, two of which are shown at 62 and 64. In similar fashion, the upper edges of the sides of the assemblage are covered with a kick panel formed of a polymeric material, two of which are seen in FIG. 1 at 66 and 68.

With the arrangement thus shown, the components, for example as at 12 and 12' may be placed within a conventional office environment and will be supplied with adequate cooled air for heat removal, distributed power, and, where desired, an uninterrupted power supply. No computer room construction is required. In general, a cooling arrangement within one module is designed to provide the capacity for one such component 12. The UPS systems are similarly designed for dedicated use with one component. Thus, it may be observed that the modular system readily grows with incremental growth of the overall facility. The height of the elevated floor 32 for the embodiment shown may be as minimal as about 10 inches, a height generally representing a step height. Preferably, the assemblage represented by system 10 will provide for adequate floor space to permit personnel access to the components as at 12 and 12'. For some installations, it further may be desirable that the components 12 or 12' rest upon floor tiles which need not be removed for maintenance access to support devices and systems contained within the modules. However, the "footprint" or square footage demanded by the system illustrated is so conveniently small as to permit its use within facilities having more restricted area availability. In this regard, for the example shown in FIGS. 1 and 3, the entire installation has a footprint dimension of about 8'×8'. Of advantage in addition to the modularity and expandability, the system 10 easily is removed from one facility or building to another and does not constitute a fixture.

Figure 2:
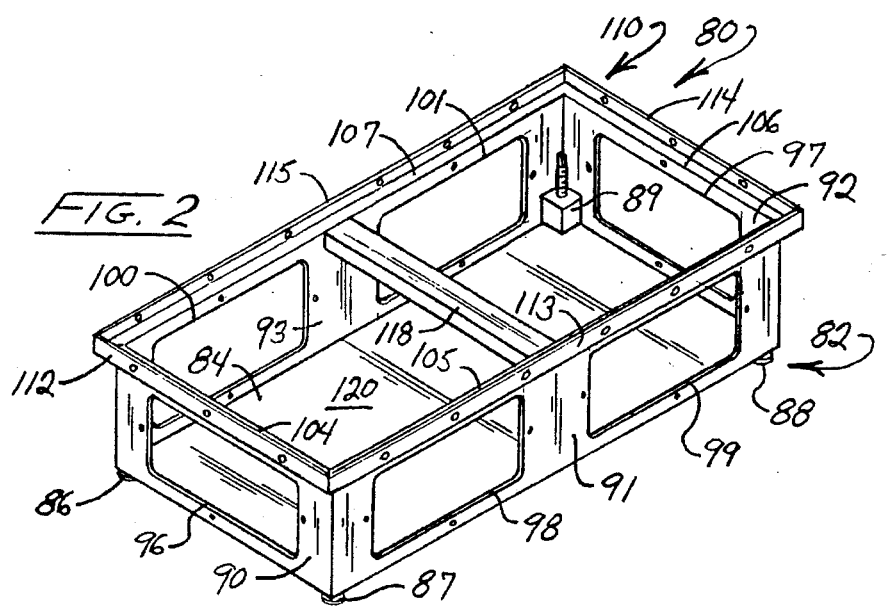
FIG. 2 is a perspective view of the frame components of a floor module as may be employed with the assemblage shown in FIG. 1.

Looking to FIG. 2, one embodiment for the frame component of a floor module is represented generally at 80. Formed, for example, of sheet steel which is welded to achieve the configuration shown, the frame component 80 is seen to have a lower portion represented generally at 82 which is supported upon the floor and includes a rectangular continuous bottom surface 84 downwardly from the corners of which floor engaging adjustable foot components are provided. Three of these components are shown at 86–88, while the upward portion of the fourth thereof is seen at 89.

Extending upwardly from the bottom 84 are side portions provided as panels 90–93. A single, rather large rectangular opening is formed within the end or shorter side panels 90 and 92 as represented, respectively, at 96 and 97. In similar fashion, lengthwise panel 91 is seen to have two spaced-apart openings 98 and 99 formed therein and oppositely disposed parallel side panel 93 is formed having rectangular openings 100 and 101 arranged in aligning symmetry with respect to openings 98 and 99. Panels 90–93 extend to respective top edges 104–107 whereupon they are bent to extend outwardly and upwardly to develop a connector flange structure form of floor tile suppot represented in general at 110 and having upstanding connector flanges 112–115. Spaced connector holes are seen located within these connector flanges 112–115 which are used to receive floor module interconnecting nut and bolt assemblies. Positioned between the upper panel edges 105 and 107 is a cross-over support 118 which is used not only to provide structural support for panels 91 and 93, but also to serve as a rest for one edge of each floor tile of the two such floor tiles utilized with each module. The floor tiles, not shown, which are positioned over the connector flange structure 110, in general, mutually abut over the cross-over support 18. To improve their noise free positioning, a thin elastomeric gasket (not shown) may be positioned over the horizontal offset portions extending outwardly from top edges 104–107. Small holes are provided in conjunction with each of the openings 96–101 for the purpose of receiving machine screws holding sheet metal panels which serve to selectively close off these openings depending upon the form of air path desired within such systems as at 10. In effect, each of the modules as at 80 provides a discrete cavity therewithin as represented generally at 120.

Referring to FIG. 3, typical uses for such cavities as at 120 are revealed. In the figure, the floor tiles 51 and 57 are seen to be removed from module 38 to reveal an air cooling arrangement. In this regard, note that an air filter 122 is shown in broken away fashion to reveal a cooling coil 124 positioned immediately beneath it. For the embodiment shown and for installations generally encountered, the type of cooling provided by coil 124 is based upon chilled water or appropriate fluid. Thus, conduiting is extended to the coil 124 as represented by conduit 126 extending to a T connection 128 which, in turn, is coupled to a feeder input 130 which, typically, will be connected to an externally disposed (outdoor) chiller component. Line 130 also is seen to extend into floor module 36 for purposes of providing chilled water to a similar air cooling coil within adjacent floor module 37. Return water from the coil 124 is provided through conduit 132 which, in turn, extends to T 134 and to output line 136. Line 136 extends to a waste water disposal outlet within the building within which system 10 is installed. Line 136 also provides the similar return function with respect to the cooling coil of module 37. Control over chilled water input to the coil 124 for the instant embodiment is provided by a relatively simple vacuum or pneumatically based valve represented generally at 138 which is located within the cavity 140 of floor module 38 in combination with filter 122 and coil 124. Because of the relatively small temperature difference between the cooled air from coil 124 and ambient air temperature, a simple control of this nature becomes available. Immediately beneath the valve 138 within cavity 140 is a flexible hose 142 which extends from a condensate pump 144 outwardly from the system 10 for disposal as waste water. A similar flexible hose 146 is seen extending outwardly from the system. Hose 146 is associated with the cooling coil mounted within floor module 37.

Also disposed within discrete cavity 140 of floor module 38 is an air blower fan 148 which, in turn, is driven from an electric motor 150. By blocking the air transfer openings, for example as described at 98, 99, 100 and 101 in FIG. 2, as they are provided at floor module 38 as well as blocking the opening, for example corresponding to opening 96 in FIG. 2 adjacent coil 124 and inserting appropriate gaskets, the input of blower 148 will establish an air flow path extending through the openings within floor tile 51 (FIG. 1), thence through the coil 124 to the input of blower 150 and thence as pressurized from the output thereof to exit through the mutually disposed panel openings at the abutting juncture of floor modules 38 and 39. To further define the air flow path, the corresponding panel openings of floor module 39 are blocked such that the discrete chamber 152 thereof becomes a plenum and cooled air may exit through an opening therein formed identically to that shown at 56 in floor tile 54. The blowers as at 148 may provide, as a minimum, about 450 cubic feet per minute of air movement. In addition to the panel openings at the elongate sides of floor module 39 being closed, the discrete cavity 152 of module 39 also contains an uninterruptible power supply (UPS) 154 which, preferably, is of a capacity wherein it is dedicated to the computer system component 12. In this regard, the device 154 may have a capacity, for example, of 3 KVA. As noted in connection with module 36, UPS 154 has an upwardly disposed switching and readout panel 156 which is located directly beneath an access door as described at 53 in conjunction with tile 52.

Floor module 40 is bolted to floor module 39 along adjacent portions of their connector flange structures as described in connection with FIG. 2. Module 40 is provided having a power distribution network 160 formed within the discrete cavity 162 thereof. The network 160 is coupled to the utility feeder inputs, for example, represented at cable 164 and provides a circuit breaker function including circuit breakers 166 and plug connector outlets represented generally at 168. These outlets at 168 provide discrete power inputs as shown at cables 170 and 172 to the UPS components within respective floor modules 39 and 36. Additionally, power is supplied, as represented at lines 17 4 and 176, to the fan motors within respective floor modules 38 and 37. One distribution network as at 160, with 100 ampere service, in general may serve up to six computer components, for example employing dedicated UPS components, condensation pumps, and blower drive motors. Thus, one main breaker and seven branch breakers are employed with the unit. In the latter regard, six of the breakers are operationally associated with computer components while one such breaker services all fan and condensation pump motors utilized.

Certain of the floor modules of the system 10 serve a storage function retaining servicing tools and the like. For the system shown at 10, such a function is assigned to floor module 41 which is bolted at abutting flange connector assemblies adjacent modules 38 and 40. The discrete cavity 180 of module 41 is seen to contain a ramp assemblage formed of two ramps 182 and 184 which, in turn, are formed of hinged ramp members which may be folded as depicted to fit within the confines of cavity 180 and beneath, for example, the cross-over supporting member 186. Also contained in the cavity 180 is a socket wrench 188 which is employed for adjusting the floor engaging foot components as described in connection with FIG. 2 at 86–89. Certain of these foot components are seen in FIG. 3, for example, at 190 at the four corners of each of the floor modules. Modules 36 and 37 are connected to and abut against corresponding respective modules 39 and 38, and are selected having identical functions for supporting computer system component 12'.

Referring to FIG. 4, the architecture involving the connecting of two modules 36 and 37 together is revealed in sectional detail. Note that the abutting upstanding connector flanges 200 and 202 of respective floor modules 36 and 37 are bolted together as represented by bolt connector 204. Flanges 200 and 202 correspond with those described at 112 and 114 in FIG. 2, three bolted connections being employed. When so connected, the adjacent side panels shown respectively at 206 and 208 are spaced apart to define a gap between the abutting floor modules 36 and 37. This structuring developed from the offset nature of the connector flange assembly facilitates the leveling of modules 36 and 37 to achieve a level floor surface 32. It additionally may be observed that the connector structures accommodate for the shape of the floor tiles. Note in this regard that floor tiles 54 and 55 mutually abut over the upstanding flanges 200 and 202. To achieve this abutment, it may be observed that the peripheries of all of the floor tiles are formed having double offsets, one offset serving for the instant embodiment as the connective or abutting surface for load transmission, while the next offset surface extending to an uppermost abutting edge. At the center of the floor modules, the floor tiles rest upon a cross-over support as earlier-described in connection with FIG. 2 at 118. Such cross-over supports are shown at 212 and 214 in connection with respective floor modules 36 and 37. As before, the abutting edges of the floor tiles are in mutual contact, while the lower offset supporting surfaces rest upon supports as at 212 and 214. At the outside edges of the system 10, the outer abutting edges of the tiles, for example tiles 50 and 52, are covered by kick panel 66 in the case of tile 50 and 216 in the case of tile 52.

Looking to the operational components and their association within the paired floor modules 36 and 37, the discrete cavity 218 of floor module 37 is seen to incorporate the cooling coil 220 of an air chiller system. Above coil 220 is a filter which is located immediately beneath floor tile 50. Floor tile 50 incorporates a plurality of air duct openings represented at 224. Immediately beneath the coil 220 is a condensate collection pan 226 which is slanted downwardly to provide a condensate receiving region 228 within which a condensate pump 230 is located. Concerning the presence of condensation, coil 220 preferably is designed such that only a minimal occasion for condensation development is present. In this regard, the range of incoming fluid temperatures to the coil will be from, for example, 45° F. to as high as 60° F. In designing the coil, an operational envelope is chosen with respect to the number of rows and area of the coil that, for essentially most room conditions, the coil will remain dry. However, in certain geographic areas, the humidity levels are so high that the condensate pan 226 will be utilized. In general, the pump 230 is arranged to turn on when a float actuated switch therein responds to about 0.75 inch of water within the region 228.

Positioned forwardly within the discrete chamber 218 of floor module 37 is a blower fan 232 having an input at 234 and an output at 236. Driven by an electric motor (not shown), similar to that described at 150 in FIG. 3, the fan 232 establishes an air flow path as represented by the arrows in the drawing. In this regard, air is drawn through the air duct openings 224 of floor tile 50 as represented at arrows 240 and thence through the filter 222 and cooling coil 220. Then, the air, as represented, for example at arrow 242, enters the input of blower 234 and exits from the output 236 thereof as represented at arrow 244. Arrows 244 represent that the air is drawn through adjacent openings of the side panels of floor modules 36 and 37 at the gap 210. To assure the integrity of this air path for the present embodiment, elongate foamaceous and elastomeric gaskets 246 and 248 are positioned at the top and bottom of gap 210. The air then enters the discrete cavity 250 of floor module 36 and exits, as represented by arrow 252, through opening 56 into the appropriate receiving base region of computer system component 12'. Air blower and motor combinations also can be installed within a floor module to direct air outwardly from a panel opening at an elongate module side.

The discrete cavity 250 of floor module 36 additionally includes a dedicated uninterruptible power supply (UPS) 254 having power input at cable 172 and a conditioned output which is coupled to component 12', for example via cable 256 which extends through the air outlet opening 56. Note, as represented by arrow 258, that the arrangement permits the flowing of air across the UPS device 254 to aid in heat removal therefrom.

The air paths thus described are defined by gasketing and the selective closure of the panel openings as earlier described at 96–101 in connection with FIG. 2. In this regard, the enclosure of the outside widthwise opening 260 of floor module 36 is by a thin sheet metal panel cover 262 which is connected to the module by sheet metal screws. That particular edge of the system 10 is considered to be unobservable being, for example, positioned adjacent a wall or the like. The correspondingly opposite end of the arrangement, for example opening 264 within floor module 37, is closed by side panel or side fascia 58. Select ones of the intervening openings are closed with panels as at 262. For example, these openings will include those shown at 266 and 268 at floor module 37. The oppositely disposed openings of module 37 also are covered in the same manner. However, to provide for the air path as represented at arrow 244, openings 270 and 272 remain uncovered. In the case of floor module 36, outboard openings 274 and 276 are closed, however, the openings disposed oppositely therefrom are open to permit air flow toward a discrete cavity 162 of floor module 40 as described in conjunction with FIG. 3. This permits a modicum of heat removal with respect to that component. However, all panel openings of the storage model 41 described in that figure are blocked.

Turning to FIG. 5, the interrelationship of the floor modules of system 10 again is represented. Note that the internal cavity 280 of outboard floor module 35 is enclosed on one side by external panel 60 and the remaining openings thereof are closed by covers, for example as at 282 and 284. Modules 35 and 36 are bolted together at their upstanding connector flanges to provide a coupling represented generally at 286. Note that opposite cover 284, the discrete cavity 250 of floor module 36 is blocked by a cover 288 to define a gap 290. No gaskets or the like are provided within the gap 290 inasmuch as no air path definition is required. Floor module 35 functions to provide access floor space for the users of the computer center.

The upstanding flange components of floor modules 36 and 39, as they occur longitudinally therebetween are bolted together to define a coupling represented generally at 292 providing a gap 294. Oppositely disposed side openings of modules 36 and 39 at gap 294 remain open and the air path therebetween is established by spaced foamaceous elastomeric gaskets 296 and 298. Similarly, the abutting upstanding flanges along the corresponding longitudinal edges of floor modules 39 and 40 are joined together at a coupling represented generally at 300 to define a gap 302. To provide for the earlier-noted air flow about distribution network 160, the panel openings adjacent gap 302 are not blocked and the air path therebetween further is defined by elastomeric foam gaskets 305 and 306. It may be observed that the gaskets at 305 and 306 or 296 and 298 as well as those described in connection with FIG. 4 permit movement between adjacently coupled floor modules while still providing for the definition of air flow paths cool air is directed to component 12 through outlet 299 in floor tile 54. In general, the panel openings within the entire periphery of the assemblage or system 10 will be blocked either by covers or fascia boards, the latter being described, for example, at 58 and 60. External panels are provided, as shown in FIG. 4 at 262 or at FIG. 5 at 308. To provide for the pneumatic integrity of the discrete cavity 162 of floor module 40 at the point of entry of cooling fluid and electrical utility input, an external conduit port 312 may be included with such panels as at 306. The upper kick panels generally are provided around the entire assemblage, one such side kick panel being shown at 310 in FIG. 5.

Considering the leveling procedure itself, reference is made to FIG. 6 where one embodiment of a foot component 190 of a leveling component, for example as used in conjunction with floor module 41, is displayed. Foot component 190 is seen to include a floor engaging lower foot 320 which is coupled to an elongate threaded stud 322 which extends to an integrally formed hexagonal nut portion 324. Stud 322 is threadably engaged within a threaded bearing block 326 which, in turn, is welded to a box-shaped steel support represented generally at 328 and welded to the bottom 330 and corner-defining sides of module 41. Thus, employing an elongated wrench as at 188 as shown in FIG. 3, the installer may rotate the stud 322 from nut portion 324 to move the assemblage 190 inwardly through an opening 332 formed within bottom surface 330. This arrangement permits the bottom surface of at least one of the floor modules to be positioned directly against the supporting floor to assure that the elevated floor surface 32 of the assemblage 10 is at a minimum height, for example, about 10 inches. Where greater elevated floor surface heights are available, then the foot 320 of the assemblies may be normally positioned below the bottom surface 330, an arrangement which is less expensive but which promotes greater elevated floor surface heights. For the latter applications, the cavity defining structure 328 is replaced, for example, by a solid steel component which may have a cross section which is round or rectangular depending upon the desires of the user.

An advantage of the modular assemblage of components of the system 10 resides in a capability for rearranging the floor modules depending upon changing processing requirements and/or changes in the geometry of the floor region available for the data center function. These alterations may require the movement of computer system components as at 12 off of and on to the elevated floor surface 32. Because a using entity typically will not have rigging equipment or the like to move these components about and only limited storage capacity, the instant system provides the foldable ramp assembly which has been described as being storable within the discrete cavity of an otherwise "empty" floor module as at 41. In general, the components themselves are movable upon casters or wheels as described in conjunction with FIG. 1, for example at 20–23. Additionally, the computer system components 12 may have an expected maximum specified weight of about 1800 pounds. Manufacturers further recommend that movement to the elevated floor surfaces 32 be along an inclined ramp or the like having about a 1:8 inclination. Thus, for the nominal 2 ft.×4 ft. size of the floor modules of the invention, a ramp pair is provided which is foldable to fit within the lengthwise extent of a given floor module. Looking to FIG. 7, the racks 182 and 184 are shown operationally positioned with respect to the system 10. Accordingly, the same numeration provided in the figures heretofore described is supplied, where appropriate, in the figure. These ramps are identically structured, in this regard, ramp 182 is formed of two upwardly facing channel members 340 and 342. Members 340 and 342 are hingedly coupled together at a hinge 344 and one such member, for example ramp member 340, is configured having two oppositely disposed L-shaped brackets 346 and 348 extending downwardly therefrom. The outward flange of each of these L-shaped brackets 346 and 348 is configured to threadably retain a foot assembly as shown, respectively, at 350 and 352. Assemblies 350 and 352 may be structured in the same manner as the foot structure including foot 320, threaded stud 322, and hex nut portion 324 described in connection with FIG. 6. That end of ramp member 342 opposite hinge 344 is, in turn, pivotally coupled to channel shaped bridging member 354 at a hinge connection 356. Bridging member 354 is of a length serving to span over a removed floor tile which, for the instant demonstration, would have been floor tile 51 as described in FIG. 1. The end of the bridging member 354 oppositely disposed from hinge 356 is seen to rest upon the next adjacent floor tile 57. Bridging member 354 additionally is coupled to a downwardly depending flange engaging coupler represented at 358 which serves to stabilize the ramp 182.

Ramp 184 is identically structured, including ramp members 362 and 364 which are hinged together at a hinge connection 366. The extended ramp is supported at the hinge connection 366 by assemblies formed of L-shaped bracket members 368 and 370 which, in turn, support floor engaging foot assemblies represented, respectively, at 372 and 374. As represented additionally in FIG. 8, a bridging member 376 is pivotally connected to one end of ramp member 364 at hinge 378. As before, bridging member 376 spans the region encompassed by the necessarily removed floor tile. A flange engaging coupler is provided, as shown in general at 380, which is seen to be formed of downwardly depending bifurcate members which extend over the upstanding connector flange 382 (FIG. 8) as well as kick panel 66. Ramps 182 and 184 are positioned so as to be aligned for the reception initially of casters 21 and 22 and then casters 20 and 23 of computer system component 12.

Figure 9:
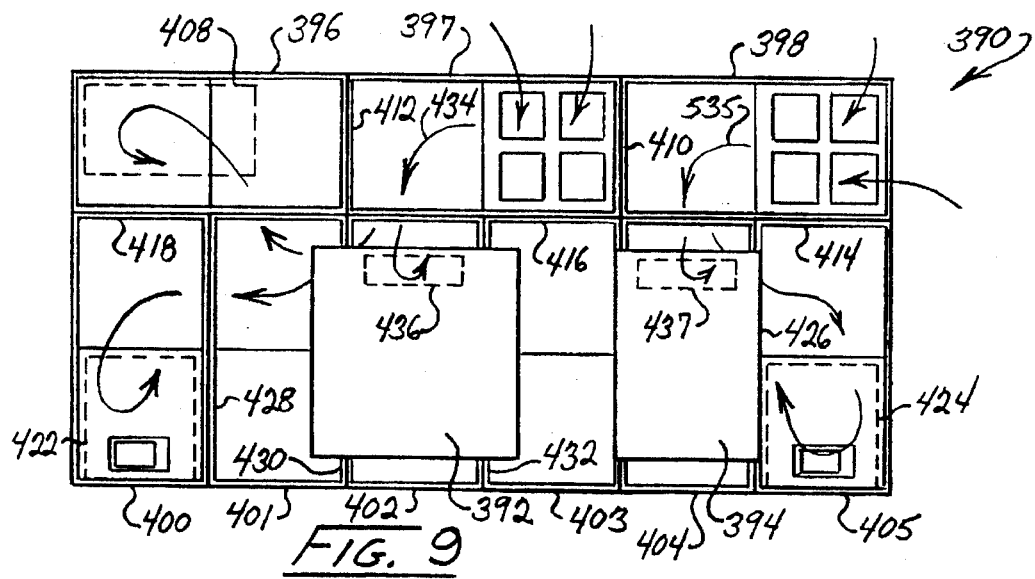
FIG. 9 is a top view of a system according to the invention showing an assemblage of floor modules with enhanced support component access.

The configuration of FIG. 1 represents a somewhat minimal one for the purpose of operationally supporting two computer system components as at 12 and 12'. With this configuration, the accessing of supporting floor modules containing equipment for conditioning air, or UPS systems requires that the computer system components be moved to clear the appropriate region for floor tile removal and access. While the components for conditioning air and UPS systems have a high reliability and a corresponding long mean time between failures, for many installations it is desirable that the floor tiles over such components be removable without any requirement for temporarily relocating the computer system components. With the addition of only one empty floor module, such a feature is accomplished. Referring to FIG. 9, an assemblage of nine floor modules achieving this desirable aspect is revealed, in general, at 390. Assemblage 390 is seen to operationally support two computer system components 392 and 394 in a manner wherein the floor modules beneath the components are empty, i.e. do not contain operation supporting instrumentalities. With the arrangement shown, a sequence of three floor modules 396–398 are coupled end to end as a linear array and against one side of this array there are positioned and connected a side-by-side array of six floor modules 400–405. Components 392 and 394 are located over empty floor modules 401–404, those modules being customized to this combination only by gaskets and the select closure of panel openings as described earlier. Positioned outwardly and readily accessible through their associated floor tiles, floor modules 397 and 398 are configured for developing conditioned air in the same manner as modules 37 and 38 heretofore described. The preferred direction for the outlet of the air circulation blowers within floor modules 397 and 398, respectively, is represented by the arrows 434 and 436. This is achieved by the relatively simple expedient of turning the fan assemblage, for example motor 150 and blower 148 as shown in FIG. 3 by 90°. Similarly, floor module 396 is configured for retaining a power distribution network and is structured identically as module 40. The power distribution network is represented in dashed form at 408. Air path development with modules 396–398 is provided initially by the closure of all panel openings about the outer periphery of the assemblage 390. Additionally, the panel openings are blocked at the connecting sides of the modules as represented at 410 and 412. Correspondingly, the panel openings are closed at the abutting sides 414, 416, and 418. The latter blockages may be observed to cover one-half of the panel openings within modules 396–398. Floor modules 400 and 405 each carry a dedicated uninterruptible power supply as represented, respectively, at 422 and 424. As noted earlier, for the present embodiment it is desirable to circulate some of the cooled air towards those UPS devices. Accordingly, the panel openings in the abutting sides between modules 404 and 405 as represented at 416 remain unblocked as do the sides between modules 400 and 401 represented at 428. Similarly, the sides abutting between modules 401 and 402 as at 430 are unblocked, while the sides represented at 432 between modules 402 and 403 are blocked. With the arrangement shown, two distinct air zones occur, one dedicated to the computer system component 392 and its associated UPS component 422 as well as the power distribution component 408. Computer system component 394 receives conditioned air from module 398 and that air also is directed to its dedicated UPS component 424. Floor tiles carrying outlet openings 436 and 437 are seen located in respective floor modules 402 and 404. This is for an orientation where the forward or facing surface of the computer components 392 and 394 are away from the triad of floor modules 396–398. Where the components 392 and 394 are positioned to face the opposite direction, then the floor tiles carrying outlet openings 436 and 437 would be positioned at the opposite location within the respective modules 402 and 404.

Figure 10:
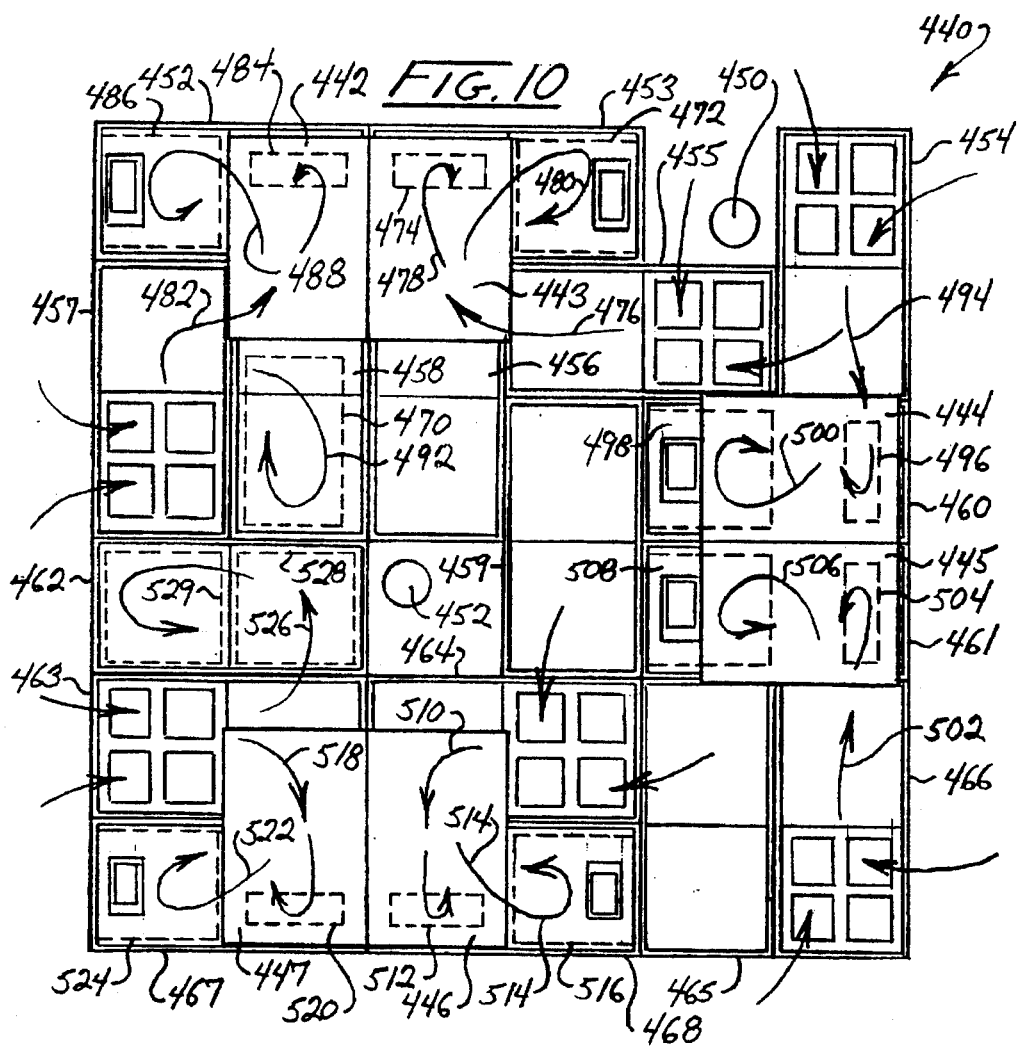
FIG. 10 is another top view of an assemblage of floor modules according to the invention showing the flexibility thereof to accommodate for varying available facility areas.

Looking to FIG. 10, the flexibility of the system at hand is illustrated in conjunction with an assemblage 440 of side-by-side computer system components 442, 443; 444, 445; and 446, 447. Of interest, the assemblage 440 provides support for these three pairs of components within a floor area having two columns or similar obstructions as represented at 450 and 452. Floor module assemblage 440 is made up of 15 floor modules identified at 452–466.

Within the assemblage 440, module 458 retains a power distribution network as represented by the dashed boundary 470. This is the same network as described at 160 in connection with FIG. 3 and provides power distribution to six computer system components and their associated blower fan motors. Network 470 is cooled by conditioned air which also functions to cool computer system component 442. Component 443 is seen to be positioned over empty floor module 456 as well as module 453 containing UPS apparatus 472. In this regard, one floor tile of floor module 453 is arranged so as to provide an air outlet as represented in dashed fashion at 474. Conditioned air for these modules is developed from module 455 having an air blower arrangement configured to blow air in the direction generally represented by arrow 476, which is seen to extend through an open panel within module 456, then as represented by arrows 478 and 480 to the air outlet 474 and the UPS component 472. Panel openings are blocked along the elongate side of module 456 as it abuts with module 458. Additionally, panel openings at the abutting widthwise edges of floor modules 452 and 453 are blocked to achieve the noted air pathway.

Computer system component 442 is serviced by the conditioned air provided by floor module 457, the blower fans of which are oriented to provide an output as represented at arrow 482, the panel opening at that location being unblocked, while all other panel openings of the module are blocked. Air path arrow 482 is seen being directed towards the air flow outlet 484 located within floor module 452. That floor module also retains a UPS system represented at 486 which, as shown by arrow 488, also is subjected to some of the conditioned air flow. In addition to the component 442 and UPS system 486, conditioned air module 457 also supplies air circulation about power distribution network 470 as represented at arrow 492. Network 470, as described in connection with module 40 in FIG. 3, retains sufficient capacity to provide circuit breaker protected service to each of the UPS systems, as well as to the blower fan and condensation pump motor within the assemblage 440.

Computer system component 444 is serviced with conditioned air from floor module 454 as represented at arrow 494. The air path thus is developed through a panel opening adjacent module 460 which also includes an air outlet 496 and a UPS device 498. Circulation of air to device 498 is represented at arrow 500. With the exception of the open panel located to confront arrow 494, all panel openings of floor module 460 are blocked.

Computer system component 445 receives conditioned air from floor module 460 as represented by arrow 502 indicating a pathway to air outlet 504. To establish the appropriate air path, all panel openings of the module 466 are closed except at confronting arrow 502. Additionally, as represented by arrow 506, air is circulated about UPS device 508 which is located within module 461. Module 465 is empty and provides for a continuous floor surface. The module is located adjacent to one end of floor module 464 which contains a coil for producing conditioned air and a blower fan which is oriented within the module to direct air in the direction indicated by arrow 510 toward air outlet 512 within adjacently disposed floor module 468. As represented by arrow 514, air also is circulated to a UPS device 516 within module 468. To develop the air path shown, all panel openings are blocked with the exception of those within modules 464 and 468 which confront the arrow or path 510.

Computer system component 447 receives conditioned air from the cooling coil and blower components within floor module 463. For this embodiment, however, two blower fans may be installed within the module 463, one oriented to direct air along the arrow 518 toward air outlet 520 within module 467. That air flow, as represented at arrow 522 also provides an air path to UPS device 524 within module 467. To provide for the air flow thus described, the side panel openings confronting the air path represented at line 518 are open. A second blower fan within module 463 also provides an air flow as represented at arrow 526 into floor module 462. Floor module 462 contains two assemblages of storage batteries 528 and 529 which function to add operational time to one or more of the UPS devices within the assemblage 440. These batteries are sealed such that in normal operation no hydrogen gas leakage occurs. To provide the air path to module 462, the side panel openings confronting arrow 526 are open within floor modules 462 and 463 while all other side panel openings within floor module 462 are blocked. A dual blower assemblage is revealed later herein in connection with FIG. 14.

Figure 11:
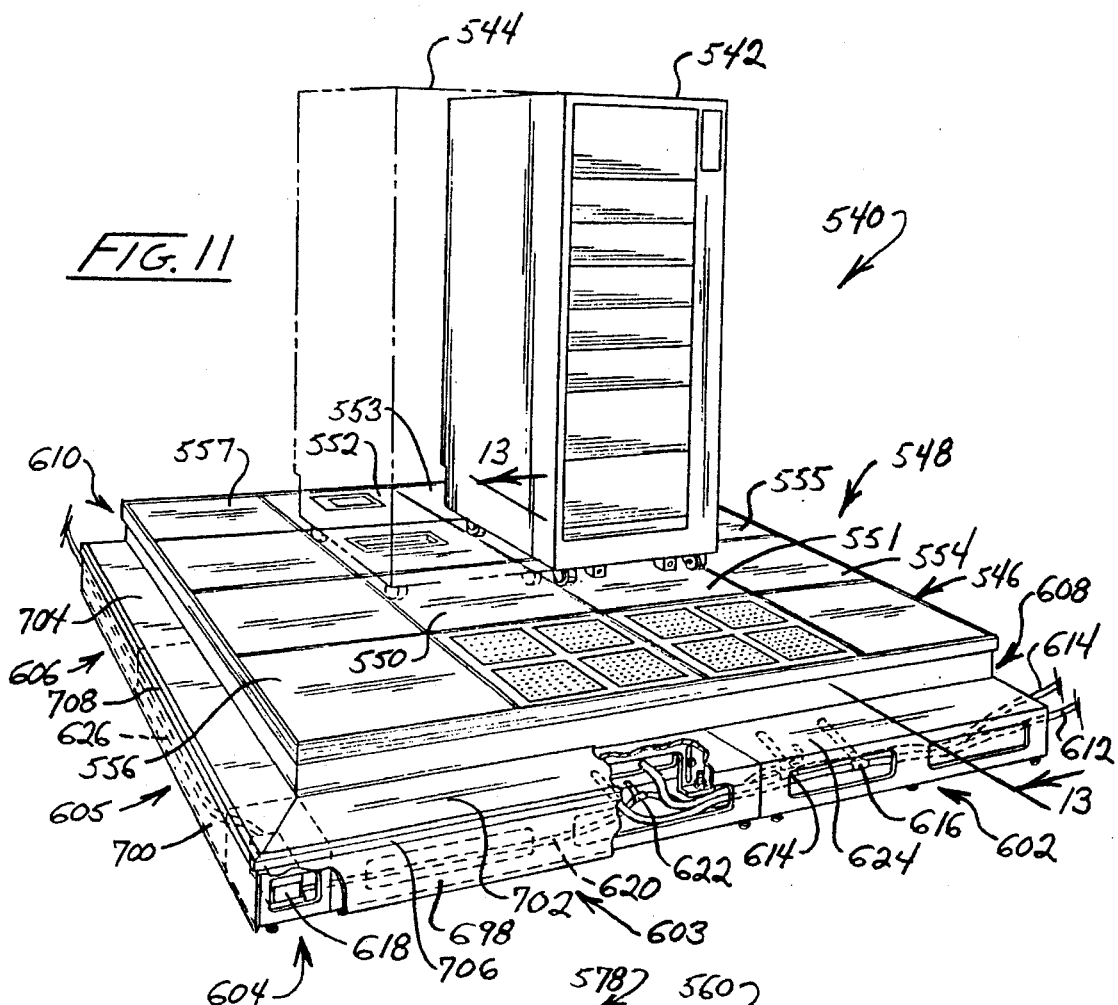
FIG. 11 is a pictorial view of another embodiment of the invention showing the floor module assemblage formed in combination with a step structure.

Referring to FIG. 11, another embodiment of the system of the invention is represented in general at 540 supporting two adjacently positioned computer system components as shown at 542 and in phantom outline at 544. Components 542 and 544 are supported by caster wheels upon the even elevated floor surface 546 of an assemblage 548 of interconnected floor modules 550–557. These floor modules are dimensioned, for example, having at top surface dimension suited for retaining two 2 ft.×4 ft. floor tiles in the same manner as described above in connection with FIGS. 1 and 2. In particular, the supporting functions of the assemblage 548 are identical to those described in connection with FIGS. 1–3, for example floor modules 550 and 551 supporting cooling coils and one or more fan blowers, while end connected modules 552 and 553 provide air outlets and UPS devices. Similarly, one other module of the grouping thereof including modules 554–557 contain a power distribution network with circuit breaker protection.

Figure 12:
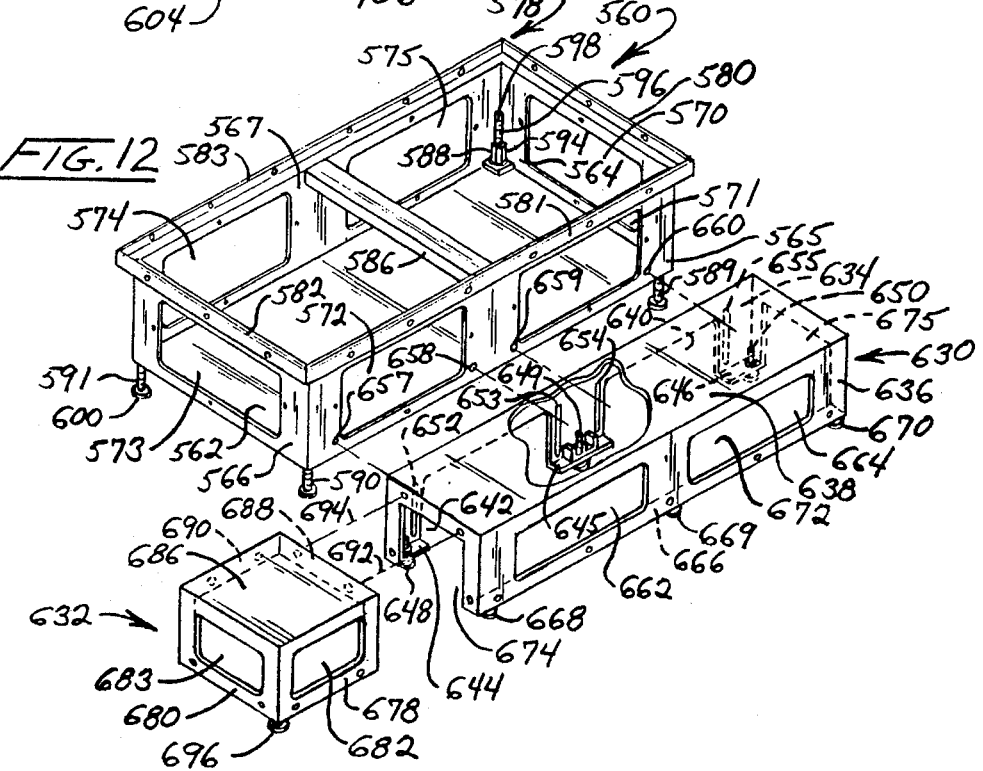
FIG. 12 is a an exploded perspective view showing a floor module frame structure and associated step structures employed with the embodiment of FIG. 11.

In general, the floor modules 550–557 are structured essentially identically as those described at 34–41 in FIGS. 1 et seq. However, the height of elevated floor surface 546 will be slightly greater than the corresponding floor surfaces of the earlier embodiment. Referring momentarily to FIG. 12, a floor module frame as is employed with the instant assemblage 548 is represented in general at 560. Module frame 560 includes a lower portion having a continuous bottom surface 562 from which extend four side panels 564–567 incorporating generally rectangular panel openings 570–575. The side panels 564–576 extend upwardly to top edges which, in turn, support a connector flange structure represented generally at 578 having offset, vertically oriented upstanding connector flanges 580–583. A cross-over support 586 provides for side panel stability and also serves as a partial seat for one edge of the abutting floor tiles used with module 560. In general, the dimensions of the module frame 560 from bottom surface 562 to the connector flange structure 578 are the same as in the earlier embodiment. However, the resulting floor module with associated floor tiles will stand higher above a given floor surface in consequence of the structuring of the floor engaging foot components 588–591 extending downwardly from bottom surface 562. While structured similarly to the component 41 described in connection with FIG. 6, the foot portions as described at 320 in FIG. 6 always are located beneath bottom surface 562, and do not retract through an opening such as at 332 shown in FIG. 6. This provides for a substantial fabrication cost reduction. In FIG. 12, exemplary foot component 588 is seen to incorporate a threaded bearing block 594 which is welded to the module at one corner of bottom surface 562. Extending through this block 594 is a component identical to that shown in FIG. 6 including a threaded stud 596 extending upwardly to a hex nut portion 598. However, the foot, for example, as seen at 600 in connection with component 591, remains below bottom surface 562. With that exception, the leveling devices perform in the same manner as the embodiments represented in FIG. 6.

Returning to FIG. 11, it may be observed that the assemblage 540 also includes a sequence of modular step structures 602–606. These step structures 602–606 are seen to be positioned in abutting adjacency against the sides 608 and 610 of assemblage 548 and serve initially to compensate for the greater height of elevated floor surface 546 by providing a step access to that floor surface. However, step structures 602–606 also serve the substantially advantageous function of retaining the cooling fluid conduits servicing the air cooling coils which, for the instant embodiment, are retained within floor modules 550 and 551 in adjacency with side 608 of the assemblage 548. This arrangement serves to facilitate the maintenance of those components and to clearly isolate fluid carrying conduits from electrical conduits. In this regard, the figure shows flexible chill water and return conduits or hoses 612 and 614 extending into the step structures 602 and 603. The conduits are tapped by "T" connectors for supplying the first cooling coil within floor module 551 and then extend to a corresponding connector (not shown) to provide fluid servicing to the cooling coil within floor module 550. Corner step structure 604 is seen to retain a condensate pump 618 having a flexible input conduit 620 extending through T connector 622 to the condensate drain pan of the cooling system within module 550 and to a similar drain pan connection 624 associated with the condensate collection pan within floor module 551. The output of pump 618 is coupled to an exhaust conduit 626 which extends through step structures 605 and 606 to an appropriate drain outlet within the facility within which system 540 is located.

Returning to FIG. 12, two exemplary step structure frames 630 and 632 are shown in association with floor module frame 560. Structure frame 630 has a generally inverted U shaped configuration with oppositely disposed floor supported side members 634 and 636 which extend upwardly a step height to a top or step surface 638. As is apparent, the height of the structure is less than that of the elevated floor surface 546. Side member 634 is formed having two openings 640 and 642 extending to the floor surface, the outer edges of which are adjacent to inward depending flanges 644–646 to which respective floor engaging foot components shown, respectively, at 648 and 650 are thread ably mounted. Additionally positioned at side member 634 are elongate vertical slots 652–655 which are located in alignment with respectively associated holes 657–660 formed within side 565 of floor module frame 560.

Side 636 of the step structure frame 630 is formed having two side openings 662 and 664 and additionally includes an inwardly depending flange 666 from which three threadably engaged and adjustable floor engaging foot structures 668, 669, and 670 depend. With the arrangement shown, the step structure frame 630 may be bolted to floor module 560 through the use of bolt and nut connectors extending through the slots 652–655 into respective poles 657–660. Slots 652–655 accommodate for floor variations Access to the step cavity 672 defined by the step structure frame 630 is provided through both end opening 674 and 675 and the side openings 662 and 664.

Step corner module frame 632 serves, as shown at 604 in FIG. 11, to provide a continuity of the step structure around a corner of assemblage 548 as well as to retain the condensate pump 618. The structure includes two side portions 678 and 680 having access openings shown, respectively, at 682–683 formed therein and which extend to a top step surface 686. Two connector flanges 688 and 690 extend downwardly from top surface 686 and incorporate spaced bolt holes intended for bolting connection with corresponding bolt holes in the sides of modules such as at 630. Two such holes are identified by alignment axes 692 and 694. A foot component 696 is coupled to an inwardly depending flange (not shown) of the structure 632.

Returning momentarily to FIG. 11, it may be observed that the outwardly disposed sides of the step structures 602–606 are covered for aesthetic purposes by fascia panels or boards, certain of which are shown at 698 and 700. Additionally, the top surfaces of the devices are covered, preferably, with tread material or the equivalent, some of which is shown at 702 and 704, and a polymeric corner molding is located between the tread and side fascia panels, two such corner molding components being shown at 706 and 708.

Referring to FIG. 13, the interrelationship of the step structure and the assemblage of floor modules is shown in enhanced detail. In the figure, step structure 602 is shown in bolted connection with floor module 551 resting upon floor surface 720. Floor tiles 722 and 724 are shown positioned upon the connector flange structure 726 of the floor module and over its cross-over support 728. Air passageway defining openings are formed within the floor tile 722 as at 730 and immediately beneath these openings is an air filter 732. Filter 732 is positioned above a chilled water coil 734 which, in turn, is positioned within the discrete cavity 736 of module 551 above a condensate collection pan 738. Note that the pan 738 slopes downwardly from the interior of module 551 towards its outside edge which is adjacent step module 602. This is the reverse of the earlier embodiment and accommodates for the collection of condensate fluid by flexible tubing 620 which is connected to the collector pan 730 at coupling 740. Extending above the pan 738 to the coil 734 are the input and output chilled water conduits which are connected to metal feed and return tubes shown, respectively, at 742 and 744. A pneumatically actuated valve 746 provides for temperature control in combination with a temperature sensing bulb-type actuator 748.

Referring to FIG. 14, an alternate blower fan assembly is shown within the cavity of module 551 at 752 as being mounted to side panel 754 with a mounting plate 756. Two blower fans 758 and 760 are seen to be mounted upon plate 756 and are simultaneously driven from a centrally disposed electric motor 762. As described in connection with FIGS. 9 and 10, the air path defining orientation of the blower assembly 752 can be altered in two directions by 90°. In this regard, a 90° alteration in one direction is represented in phantom in the figure, showing mounting plate 756 at location 76' in combination with blower fans 758 and 760 being shown at 758' and 760' in combination with motor 762 being shown at 762'. The opposite orientation of the assembly 752 is shown with mounting plate 756 being positioned at 756" against the opposite side of module 551. This positions the blower fans as shown at 758" and 760" in combination with the motor at 762".

Returning to FIG. 13, the foot structures as earlier-described in connection with FIG. 12 are shown at a higher level of detail, for example at 764–766. Module 551 is seen coupled to module 552 in the manner earlier disclosed, i.e. by the attachment of upstanding abutting flanges 768 and 769. This defines a gap 770 between the modules and the air flow path therebetween is further established through the selective utilization of elastomeric foam gaskets as at 772 and 774.

Referring to FIG. 15, an alternate embodiment for selectively blocking the side panel opening of the floor modules and for, where appropriate, establishing an air path is revealed. In the figure, a floor module 776 is connected to an adjacent floor module 778 at their abutting connector flange structures respectively represented generally at 780 and 782. Thus, a gap 784 is developed between the modules. Within this gap 784, there is positioned an elastomeric foam insert 786 which is configured having a partially cut-through or die cut knock-out insert corresponding with the shape of an associated oppositely disposed pair of panel openings. The die cut positioning in the figure is shown partially in dashed form at 788 and 790 adjacent the panel openings 792 and 794 of respective floor modules 776 and 778.

With the higher structure involved in the instant embodiment, a space is located immediately beneath the gaps as at 784 as represented at 796. This space advantageously may be employed for the purpose of routing coolant fluid lines to interior areas of more complex assemblages of floor modules. Such fluid carrying conduit is shown in the figure at 797 and 798. By so positioning this fluid carrying function, it is separated from electrical conduit components. Alternately, electrical cables may be so distributed.

Figure 16:
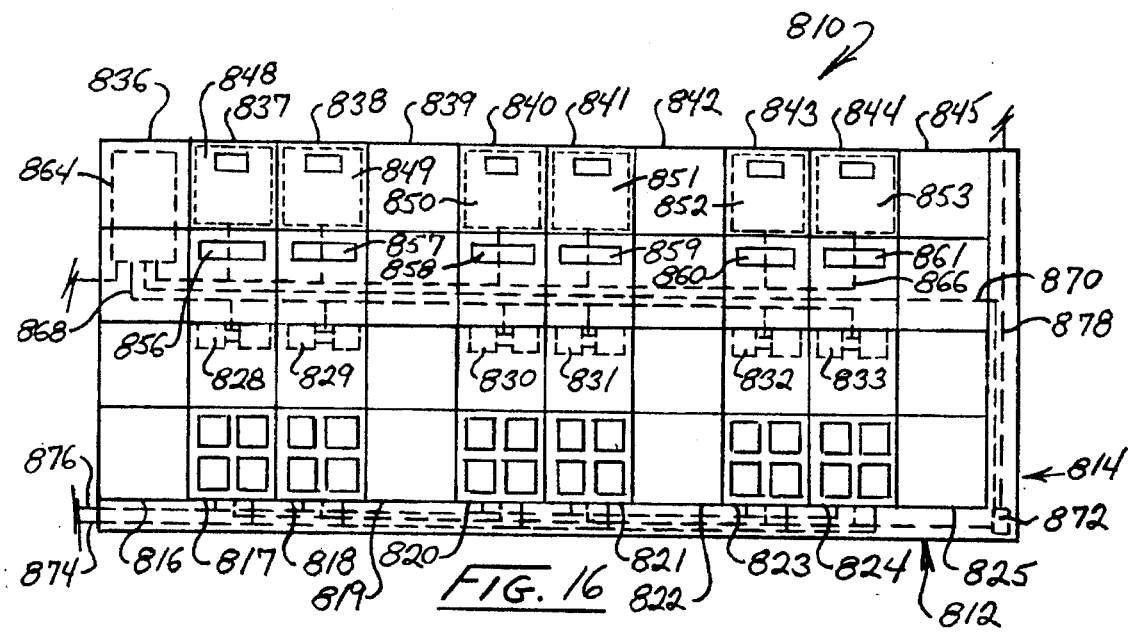
FIG. 16 is a top view of a floor module assemblage and associated step structure according to the invention schematically showing the positioning of fluid carrying conduits and power distribution conduits.

Looking to FIG. 16, a floor module assemblage 810 is shown in plan view as it is associated with side positioned step structures 812 and 814. The figure shows the advantageous isolation of cooling fluid carrying conduits from the electrical distribution lines within the assemblage 810. In the figure, a sequence of ten adjacently disposed floor modules 816–825 are positioned such that their widthwise edges are coupled with side structure 812. Of these floor modules, those at 817, 818; 820, 821; and 823, 824 carry cooling coils and blower fan assemblies which are shown in phantom, respectively at 828– 833. Connected with the floor modules 816–825 are corresponding power supply supporting floor modules 836–845. Of these floor modules, those at 837,838; 840, 841; and 843, 844 carry UPS devices represented, respectively, at 848–853. Those same modules also are provided with floor tiles carrying earlier-described air outlets over which computer system components are positioned. The outlets for the modules are represented, respectively, at 856–861. Supplying power to the UPS components 848–853 is a power distribution network within floor module 836 as shown at 864. The power distribution from network 864 to the UPS devices 848–853 is represented by dashed line 866, while the corresponding power to blower fan assemblies 828–833 is represented at dashed line 868. One other dashed line at 870 is shown as being directed to a condensation pump 872 at the corner component intermediate step structures 812 and 814.

Liquid cooling inputs to the cooling coil assemblies in modules 817, 818; 820, 821; and 823, 824 are provided from within step structure 812 as represented by the input and return dashed lines 874 and 876. From the foregoing, it may be observed that there is an ideal separation between power distribution conduits and cooling fluid carrying conduits with the exception of the condensate pump 872 output represented at dashed line 878 within step structure 814 which is adjacent to the power input to that pump. However, the opportunity for liquid movement through the conduit represented by line 878 is quite remote for most installations.

Figure 17:
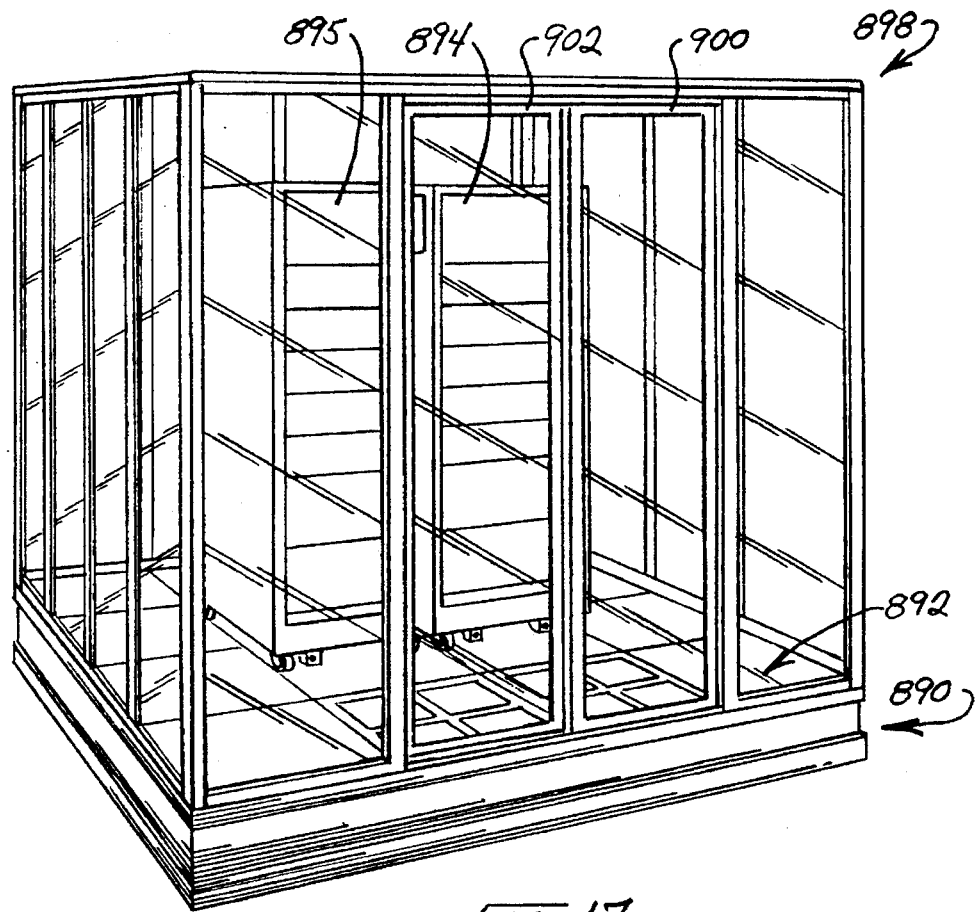
FIG. 17 is a pictorial representation of an embodiment of the system of the invention showing a floor module assemblage in combination with an environmental confinement enclosure.

Some installations of computer systems require their positioning not in an office environment but in somewhat harsh environments as may be encountered in the chemical or metals industries. Additionally, for some installations, dedicated fire protection for the computer components may be desired. Typically, for conventional sealed computer room installations, this fire protection is provided with Halon gas based systems. In general, this gas is a fluorocarbon which has undesirable environmental-atmospheric effects upon its being released to the atmosphere. Accordingly, a restricted envelope which limits the extent of its use is desirable. Looking to FIG. 17, an assemblage of floor modules identical to that, for example, shown in FIG. 1 is shown in general at 890. The elevated floor surface shown generally at 892 for assemblage 890 is seen to support two side-by-side computer system components 894 and 895. To protect these components 894 and 895 from harsh atmosphere and/or to confine them for dedicated fire protection purposes, an environmental confinement enclosure 898 is positioned over them and upon the outer edge of elevated floor surface 892. Access to the computer system components 894 and 895 within this enclosure 898 is provided, for example, by sliding doors 900 and 902. Additionally not shown in the figure is a Halon based fire protection system. It may be observed that a substantially smaller amount of this fluorocarbon gas is required for providing protection for components 894 and 895, the enclosure 898 covering a floor surface, for example, of about 8 ft×8 ft with a height of, for example, 7 ft.

FIGS. 18–23 illustrate a preferred embodiment for the substructure assemblage of the invention. Looking to FIG. 18, the assemblage is seen represented in general at 900 being formed of six floor modules 902–907 which are interconnected to form an elevated floor 910 of predetermined peripheral geometric shape. This shape is seen to provide four linear side portions 912–915. Of these linear side portions, two, as at 914 and 915 are considered, for the present illustration, to be located in adjacency with a corner form of wall structure. The remaining two linear side portions as at 912 and 913 are each associated with step assemblies respectively represented in general at 918 and 920. Of the floor modules 902–908, module 902 is configured as dedicated to retain an uninterruptible power supply (UPS) and is shown to carry floor tiles 922 and 923. Floor tile 922 is shown having a pattern of openings, however these openings are for the purpose of air discharge. Next adjacent to floor module 902 is floor module 903 which supports floor tiles 924 and 925. Floor tile 924 also is formed having a pattern of air transfer openings or perforations and these are for the earlier-described purpose of providing air ingress to a cooling coil and air circulation blower assemblage to which function the floor module 903 is dedicated. Next adjacent to floor module 903 is floor module 904 which supports floor tiles 926 and 927. Floor module 904 is dedicated to providing a power distribution with circuit breakers. Floor module 905 is seen supporting floor tiles 928 and 929 and may be employed for the purpose of retaining batteries for the UPS function within floor module 902 or a loading ramp as earlier described in conjunction with FIGS. 7 and 8. Next adjacent to floor module 905 is a floor module 906 which supports a split floor tile assembly including a forward floor tile portion 930 and a rearward floor tile portion 931 within which an air outlet 932 is positioned. Air outlet 932 serves the same function, for example, as outlet 56 as shown in FIG. 1. With the arrangement shown, split floor tiles 930 and 931 abut against each other at abutting line 934. As a consequence, split tile 931 can be removed by servicing personnel without moving an adjacent computer system component, the base region of which is located over the opening 932. It may be recalled that power input cabling and the like is directed to the computer component through the opening 932. Positioned rearwardly of split tile 931 is a floor tile 935.

Next adjacent to floor module 906, floor module 907 is seen to support floor tiles 936 and 937. As in the case of floor module 905, floor module 907 may be empty or carry loading ramps or battery supplies for the UPS dedicated function of floor module 902.

Step assmbly 918 is coupled to the end side portions of floor modules 902–904 and is configured having three step defining structures or components 940–942. In similar fashion, step assembly 920 is formed within three step defining structures 944–946 of the same lengthwise extent as step defining structures 940–942. Additionally, the assembly 920 includes a corner step defining structure 948. Similar to the earlier embodiments, polymeric kick panels are provided above the step structures, certain of which are identified at 950. For the present embodiment, the kick panels 950 are provided in discrete lengths corresponding with the side portions of the floor modules to which they are attached. Preferably, the step surfaces are covered with polymeric step treads to promote user safety.

Floor modules 902–907 are configured slightly differently than those modules heretofore described. Looking to FIG. 19, the instant version of a floor module is represented in general at 952. Module 952 has a lower portion 954 which includes a rectangular bottom surface 956 and four vertically adjustable floor engaging foot components, portions of which are seen at 958–961. As before, the module 952 is configured as a frame having four side panels 964–967 which are bent upwardly from the bottom surface 956 and extend upwardly to edge portions shown, respectively, at 968–971. Note in this regard that the edge portions are not configured having their earlier-described outwardly extending flange structures. However, each of the side panels is configured, as before, incorporating panel or access openings. In this regard, side portion 964 is seen to be formed having two panel or access openings 974 and 975; side portion 965 is configured having corresponding panel openings 976 and 977; side portion 966 is configured having a panel or access opening 978; and side panel 967 is configured having access opening 979. These openings 974–979 may be selectively blocked by sheet blocking panels (not shown) which are positioned upon the inside surfaces of the side panels 964–967 as desired. Securement is made by inwardly depending lances or tabs, certain of which are shown at 982 at the lower regions of the openings and, such panels are coupled adjacent the upper edges 968–971 by bolting utilizing the floor module-to-floor module interconnecting holes or openings, certain of which are identified at 984.

A center or cross-over support 986 is provided with the module 952. This support 986, as in the case of the side panels, terminates upwardly in an edge portion as at 988. The support 986 is retained in position by inwardly formed tabs or lances 990 and 992, which engage the oppositely disposed fight angle oriented tips of support 986.

In putting together an assemblage as at 900 of the floor modules 952, the side portions or panels 964–967 are simply bolted together at the upwardly disposed matched openings 984. This technique of interconnecting the floor modules is compared with the outwardly extending flange arrangement of the earlier embodiments. Utilization of the earlier external flanges provided a rugged and precise assemblage wherein the module flange dimensions were matched to the particular floor tile shapes provided by given suppliers. Another aspect of this design resides in its broad tolerances for variations from square and the like. With the instant embodiment, the high tolerancing earlier available momentarily is lost but then recovered through the utilization of tile supports or expanders which freely abuttably fit over the paired edge portions 968–971 of adjacent floor modules. Additionally, these tile supports fit over the upper edge portions as at 988 of cross over supports 986. This permits a more simple and thus more economical fabrication while again allowing for larger dimensional tolerances for the system. An edge expander or tile support as employed with the invention may be formed as a relatively simple extrusion, one of which is represented in the figure at 994 having an internally disposed channel 996 which fits over, for example, the upper edge portion 971. These tile supports may be simply fabricated to match individual cross-sectional profiles of the floor tiles of various manufacturers. Along the outside perimeter of any assemblage as at 900, where step assemblies as at 918 and 920 are provided, then floor tile support along those peripheries is provided by an inwardly depending flange associated with the step structures. For a periphery where the step structure is not present as at 914 and 915, then a peripheral flange configured simply as an inwardly bent sheet is bolted through the openings 984.

Looking additionally to FIG. 20, a sectional and enlarged view showing the utilization of tile support or expander 994 with respect to adjacently coupled floor modules is provided. In the figure, the outwardly disposed surfaces of two adjoining side panels or side portions as at 1000 and 1002 are joined together by a nut and bolt connection 1004 extending through adjacently aligned openings 984. This provides a paired edge portion arrangement represented generally at 1006. The tile support or expander 994 is shown such that the paired edge portion 1006 is inserted within channel 996 to abut against an internally disposed contact surface 1008. Surface 1008 is oppositely disposed from tile support surface 1010 which, in turn, supports the peripheral beating surfaces 1012 and 1014 of respective floor tiles 1016 and 1018. Note that floor tiles 1016 and 1018 have a cross-sectional periphery which is different than the floor tiles described earlier herein. From the support surface 1012, the support 994 is formed extending downwardly to provide two inwardly depending tab portions 1020 and 1022, each of which is freely abuttably engageable with an inwardly disposed side surface of respective side portions or panels 1000 and 1002. With the arrangement shown, force represented by floor weight transmitted from floor tile 1016 may be represented by force vector arrow 1024. This creates a turning moment providing for a transfer of force somewhat horizontally as represented by vector arrow 1026. Tolerancing movement of the floor tile 1016 against device 994 may be accommodated by twisting of the latter component in response to various forces, for example, as represented by arrow 1028. Such forces will develop a corresponding slight slidable movement of the contact surface 1008 over the paired edge portions arrangement 1006 to provide a broadening of tolerancing. With the floor tiles in place over a floor module frame, a chamber is developed which may be employed for retaining a dedicated support facility such as the earlier-noted cooling coil and fan, UPS system, or power distribution network.

Referring to FIG. 21, the interconnection of floor modules 902 and 905 is shown in cross-section. The figure shows floor module 902 to have a bottom surface 1040 supported above floor 1042 by vertically adjustable foot components, two of which are revealed at 1044 and 1046. Locking panels 1048 and 1050 are seen as they cover panel openings (not shown). The panels, for example as at 1050, are retained at their upper regions by bolt and nut connections as at 1052, while the lower portions thereof are retained by tabs or lances earlier described in connection with FIG. 19 at 982 and one of which is revealed in FIG. 21 at 1054. An uninterruptible power supply (UPS) 1056 is seen to be mounted within floor module 902, the elongate side portion thereof being revealed in FIG. 21. UPS 1056 is retained in position by flange components, one of which is revealed at 1058, and is seen incorporating a self-contained cooling fan shown in phantom at 1060. UPS 1056 does not utilize the cooling output of the cooling coils, for example within module 903, but is self-sufficient in that regard. This arrangement is made, inasmuch as in the case of a utility power failure, it is desirable that the UPS 1056 continue to perform under battery power for as long as possible. Where the cooling features from module 903 are utilized to cool UPS 1056, then that interval of available emergency power will be more limited. To isolate UPS 1056, the floor module 902 includes a blocking panel assembly shown generally at 1062 which extends across its width rearwardly of UPS 1056. In this regard, the panel 1062 includes a sheet metal frame 1064 which is attached to cross-over support 1066 and extends rearwardly thereof to provide an air path cavity 1068. Panel 1064 has a centrally disposed opening over which a flexible polymeric curtain 1070 extends having a slit within it to flexibly receive and pass the plug and cable power input which extends from a power distribution network within floor module 904 to the rear side of UPS 1056. The forward panel opening at 1076 of floor module 902 is unblocked and provides for both manual and air transfer access to forward face 1074 of UPS 1056. The air circulation path established by UPS 1056 includes an air input opening in the form of a grill as seen at 1078 in FIG. 23, which will have a designed air transferability capability. The air path developed by fan 1060 is shown in FIG. 21 at arrows 1080 extending through the air opening 1078 at forward side 1076, thence through fan 1060 to exit from the air output thereof as represented at arrow 1082, and then, as represented by arrows 1084, the air exits through the opening pattern within floor tile 922. Air input to UPS 1056 through the opening 1076 is provided through a cavity 1086 within step assembly 918 when in the closed orientation shown in solid line fashion in FIG. 21. It may be observed that the step structure 918 includes a step base 1088 which rests upon floor 1042 and which is bolted to floor module 902. In this regard, the base 1088 has a connector portion 1090 which is bolted to the side surface of floor module 902. The base extends oppositely therefrom to an upstanding forward portion 1092 which supports a vertically adjustable step support assembly 1094. Assembly 1094, in turn, adjusts the height of the step surface 1096 of step defining structure 940. That structure further includes a hinge assembly 1098 which is bolted to the side portion of floor panel 902 and a riser portion 1100 extending outwardly from the upstanding forward portion 1092 of step base 1088. This defines an elongate air transfer opening 1102 permitting the development of an air input path represented at arrows 1104 when the step structure 918 is in its seated position. The structure is pivotable about hinge assembly 1098 as represented at 940' in phantom. When in this open position, the forward hand actuable invisible control components of UPS 1056 as are illustrated in FIG. 23 at 1078 are readily accessible to servicing personnel.

FIG. 21 additionally reveals the interconnection of floor module 902 with floor module 905. In this regard, a bolt and nut connection of the side portions of the floor modules is made at the openings along the upper region of the module sides. Once such bolt and nut assembly is shown at 1110 in conjunction with a tile support 1112 which is configured as described, for example, at 994 in FIG. 20. Such connection places foot component 1046 of floor module 902 in adjacency with corresponding foot component 1114 of floor module 905. These foot components preferably are fashioned as an earlier described floor engaging component having a threaded upstanding shaft which extends through and is threadably engaged with a nut structure as at 1116 in the case of foot component 1046 and 1118 in the case of foot component 1114. The latter nut structures are welded to the bottom surfaces of the floor modules. On the inside of the floor modules, the upstanded threaded studs are retained in position by nuts which are tightened against the upward surface of the interior of the floor modules. Shown additionally in FIG. 21 is a polymeric, channel-shaped cable protector 1118 which fits over the upwardly depending and adjacent edges of the panel openings of the adjacent floor modules. This protects cabling such as at 1072. Floor tile support at the periphery of the assemblage is provided by an angular sheet metal tile support 1113 forming part of step struture 940 as shown in the figure supporting the peripherally disposed edges of tile 922.

Referring to FIG. 22, the configuration of the step structure used with the floor module assemblage is revealed in more detail. The particular step structure shown is one including a corner as seen in FIG. 18 at 948 and which is similarly identified in the instant figure. Step 948 includes a step base represented generally at 1120 which includes a pan-like floor supported bottom surface 1122. Bottom surface 1122 extends at one side to an upstanding connector portion 1124 having oppositely disposed slots 1126 and 1128 through which the connector portion 1124 is bolted to the side portion of a floor module. The elongate vertical slots 1126 and 1128 permit the step base to be floor supported, notwithstanding floor surface variations.

Bottom surface 1122 extends forwardly to an upstanding forward portion 1130 which, in turn, supports two spaced-apart vertically adjustable step support assemblies represented generally at 1132 and 1134. Assemblies 1132 and 1134 are formed essentially identically as the foot supports for the floor modules but are mounted oppositely. In this regard, they include an upwardly-disposed contact surface portion 1136 from which there depends a threaded rod 1138 as shown in conjunction with assembly 1134. The threaded rod carries a tightening nut 1140 and is threadably engaged with a nut 1142 welded to the inwardly depending flange 1144 of forward portion 1130. Step support assembly 1132 is structured identically to that described at 1134.

Step structure 948 is at a corner of the assembly and, accordingly, includes a step corner base shown at 1146 which may be bolted to base structure 1120. Corner base 1146 is configured having a floor supported bottom surface 1148 which extends to two upstanding outer portions 1150 and 1152. The inwardly-depending upper flange 1154 of outer portion 1152 serves to support two vertically adjustable step support assemblies 1156 and 1158 which are configured identically with the support assembly 1134. Connection of the step corner base 1146 to corresponding base 1120 is at their mating end flanges, one of which is shown at 1160 in conjunction with upstanding portion 1130. A bolting connection is made for uniting the two bases.

Looking at the step structure 948 for this corner assembly, a step surface as shown at 1162 is seen to extend to a riser 1164 as well as to an end riser 1166. This riser combination 1164 and 1166 is vertically dimensioned to permit development of an air gap between the riser and the forward portions 1130 and 1150 of the respective base structures 1120 and 1146. This gap is revealed in FIG. 23 at 1168.

The inwardly disposed portion of step surface 1162 is coupled with a vertical offset sheet component 1170 which extends to a horizontally disposed hinge 1172. The opposite side of hinge 1172 is provided as a flange 1174 having three spaced openings therein for bolted attachment to the side portion of a floor module as at 902 as well as an inwardly depending tile suppot portion. Additionally coupled through those openings is a kicker as described earlier at 950 and identified by the same numeration herein.

With the offset 1170, the step defining structure 948 has a stable open position as demonstrated at 940' in FIG. 21. This permits servicing personnel to move a step defining structure from its seated to an open position, and it will remain stably at that open position while service procedures are being carded out.

Because the particular step structure 948 encompasses a step corner, the corner defining portion of it is buttressed with a box beam assembly shown generally at 1176. Accordingly, the step support assembly 1158 will be at a lower elevation than the forward support assembly 1156.

Turning to FIG. 23, the highly desirable servicing access to the principal dedicated modules for UPS, cooling, and power distribution is illustrated. In the figure, UPS 1056 is shown, as well as the earlier-noted air intake or grill 1078 as well as any visual readouts or manually actuable control switches and the like. With the arrangement, ready access is provided for all forms of start-up and interim adjustment procedures without the need for, example, moving a floor tile. Further, access openings formed within the floor tiles are not required to permit an uninterrupted integrity of the floor surface. Next adjacent to the floor module 902 dedicated to a UPS service, is floor module 903 which incorporates a cooling coil and blower fan. The cooling coil adjustment and set-up components are readily accessible through the panel opening at the side portion of floor module 903. As seen in the figure, the fittings made accessible to the service personnel include an input chill water conduit and associated fitting 1176; a corresponding exit chill water conduit and fitting 1178, and a condensate water coupling and associated conduit 1180. A vent tube 1182 is incorporated within the conduit and fittings 1180 to facilitate the flow of condensate fluid from a drain pan (not shown) positioned beneath the coil. Condensate conduit 1180 is seen to be directed to a condensate pump retained within the step cavity defined by step component 1162.

Hand actuable control over the operation of the cooling coil is provided by the hand setting dial 1186 of a thermostat having an output control line leading to a mixer valve 1188 coupled, in turn, to the chill water input conduit and coupling 1176.

Experience with the operation of floor modules as at 903 within which a cooling coil and fan are mounted has demonstrated that the utilization of blocking panels to close access openings for the purpose of forming airflow guide paths is not necessary. In general, the same air flow quality and quantity is present at opening 932 (FIG. 18) with or without the closure of access openings to establish air ducts leading to such openings.

Next adjacent to the cooling coil and blower retaining module 903 is a power distribution network dedicated floor module 904. The power distribution network is shown within a console 1190 having an array of six circuit breakers 1192 providing protection over corresponding six computer system components. Additionally, a circuit breaker 1194 is dedicated to protection of cooling system fans and the condensate pump 1184. Finally, a plug outlet is provided at 1196 for powering condensate pump 1184. This is the only electrical cable which is contained within the step cavity.

Since certain changes may be made in the above-described system and apparatus without departing from the scope of the invention herein involved, it is intended that all matter contained in the above description or shown in the accompanying drawings shall be interpreted as illustrative and not in a limiting sense.

I claim:

1. A floor supported substructure assemblage for a computer component having a given base peripheral configuration with a base region through which heat removing air may pass, said component having given operational heat generation and power consumption characteristics, comprising:

a plurality of floor modules, each having a lower portion supported upon said floor and having side portions with access openings, extending upwardly from said lower portion to support an elevated floor surface at a given floor height and defining a module chamber intermediate said lower portion and said elevated floor surface, said floor modules being arranged in a said assemblage of predetermined peripheral geometric shape including a linear side portion;

a said floor module having a said side portion forming said assemblage linear side portion, having a cooling coil mounted within said chamber thereof and having cooling fluid coupling components manually accessible through said access opening at said linear side portion, connectable with cooling fluid conduits, and said cooling coil being located within an input air path extending to an air intake;

the said elevated floor surface of a said floor module supporting said computer component and having an air outlet formed therein for providing air transfer communication with said base region;

a said floor module chamber retaining an air circulation blower having an input for receiving air from said input air path and an air flow output providing air cooled at said cooling coil to said air outlet;

a step assembly connected in adjacency with said assemblage at said linear side portion, having a step defining structure with a step surface located at a select height less than said floor module given floor height, said step defining structure being pivotally movable between a seated position supported by said floor and defining a step cavity and an open position providing manual access to said access opening at said linear side portion; and said cooling fluid conduits being located within said step cavity and coupled with said cooling coil at said cooling fluid coupling components.

2. The substructure assemblage of claim 1 in which:

a said floor module having a said side portion forming said assemblage linear side portion includes a power distribution network mounted within said module chamber thereof, having an output connected in power supply relationship with said air circulation blower, and having a plurality of hand actuable circuit breakers manually accessible through a said access opening at said linear side portion; and said circuit breakers being manually accessible through said access opening when said step defining structure is in said open position.

3. The substructure assemblage of claim 1 in which:

a said floor module having a said side portion forming said assemblage linear side portion includes an uninterruptible power supply mounted within said module chamber thereof, having an output capacity corresponding with said power consumption characteristic, having an output connected in power supply relationship with said computer component, having a hand actuable control component manually accessible through a said access opening at said linear side portion; and said control component being manually accessible through said access opening when said step defining structure is in said open position.

4. The substructure assemblage of claim 3 in which:

said uninterruptible power supply includes a self-contained air circulation fan at one end having an air output, an air input opening of given air transferability extent at an opposite end adjacent to and in air transfer communication with said access opening at said linear side portion;

said step assembly defines an air transfer opening of air transferability extent at least equivalent with said given air transferability extent when said step defining structure is in said seated position' to form an air input to said air input opening; and said floor module within which said uninterruptible power supply is mounted is configured to define an air flow path extending from said air input path to said air circulation fan and from said air output to the ambient environment external to said assemblage in substantial isolation from said air cooled at said cooling coil.

5. The substructure assemblage of claim 1 in which said step assembly includes:

a step base having a floor supported bottom surface extending to an upstanding connector portion connected with a said side portion of a said floor module located at said linear side portion and extending oppositely to an upstanding forward portion, said upstanding forward portion including a vertically adjustable step support assembly; and said step defining structure includes a riser portion depending downwardly from said step surface and extending outwardly from said step base forward portion when in said seated position, a hinge assembly depending from said step surface and connected with a said side portion of a said floor module located at said linear side portion.

6. The substructure assemblage of claim 5 in which said step surface is supported and vertically positioned at said select height by abutment of said adjustable step support assembly with said step defining structure at a location beneath said step surface.

7. The substructure assemblage of claim 6 in which said adjustable step support assembly comprises at least two foot components having upwardly disposed contact surfaces abuttable with said step defining structure when in said seated position and being threadably engaged with and supported from said step base.

8. The substructure assemblage of claim 6 in which said step defining structure riser portion is located outwardly from said step base upstanding forward portion and above said floor supported bottom surface an amount effective to define an air transfer opening of predetermined extent when in said seated position.

9. The substructure assemblage of claim 1 in which:

each said floor module comprises:

a frame having a rectangular bottom surface at said lower portion and four side panels as said side portions, said side panels extending from said bottom surface to an edge portion, defining four corners, having vertically oriented outwardly and inwardly disposed side surfaces, and having said access openings formed therein, said lower portion further including a vertically adjustable floor engaging foot component mounted upon said frame in the vicinity of each said corner, and at least one floor tile positionable upon said frame, having a downwardly depending peripheral bearing surface in load transfer relationship with said side panels through said edge portion.

10. The substructure assemblage of claim 9 in which:

said floor modules are arranged to form said assemblage such that select said side panels of adjacently disposed floor modules are in abutting adjacency; and including a tile support positioned over paired said edge portions of adjacent said side panels, said tile support being supported from and extending along said paired edge portions and having an upwardly disposed support surface abuttably engaging a said floor tile peripheral bearing surface to transfer load therefrom to said paired edge portions.

11. The substructure assemblage of claim 10 in which said tile support is configured having a downwardly depending contact surface located substantially opposite said support surface slidably abuttably engageable in force transfer relationship with said paired edge portions, and two, mutually inwardly depending tab portions spaced downwardly from said contact surface and each freely abuttably engageable with a said inwardly disposed side surface.

12. The substructure assemblage of claim 1 including an environmental confinement enclosure positioned over said assemblage elevated floor surface, having side walls extending from said elevated floor surface to a top cover located above said computer system component, and having a normally closed access opening for accessing said computer system component.

13. The substructure assemblage of claim 9 in which:

said floor module lower portion bottom surface is rectangular and has a predetermined widthwise extent and a lengthwise extent substantially twice said widthwise extent;

including a crossover support extending between said side portions extending along said lengthwise extent; and said elevated floor surface is provided as two substantially square said rigid floor tiles.

14. The substructure assemblage of claim 13 in which:

said computer system component is movably supported upon spaced apart wheels mounted at said base region; and including a ramp assemblage comprising two ramps each formed of two ramp members foldably coupled together at a hinge connection, one end of a said ramp member being hingedly coupled with a bridging member extensible to and supportable upon a said floor tile at a location over said crossover support, each said ramp including a downwardly depending coupler configured for abuttable positioning over a said side portion, said ramps being positionable in spaced apart relationship corresponding with said spaced apart wheels for receiving said wheels and supporting said computer system component for movement on and off of said assemblage elevated floor surface.

15. A floor module for use in assembling a floor supported substructure configured to support a computer system component having given operational heat generation and power consumption characteristics, comprising:

a frame having a rectangular bottom surface and four side panels extending therefrom to an edge portion defining four corners and vertically oriented outwardly disposed and inwardly disposed side surfaces, said side panels having access openings formed therein;

a tile supoprt mounted upon and extending along said edge portion and having an upwardly disposed support surface;

a vertically adjustable floor engaging foot component mounted to said frame in the vicinity of each said corner;

at least one floor tile positionable upon said frame, having a downwardly depending peripheral bearing surface abuttably engageable with said support surface and defining a cavity with said frame; and a blocking panel removably connectable with said side panel at said inwardly disposed side surface to cover an adjacent said access opening.

16. The floor module of claim 15 including connector openings formed extending through said side panels adjacent said edge portion.

17. The floor module of claim 15 in which said tile support is configured having a downwardly depending contact surface located substantially opposite said support surface, slidably abuttably engageable in force transfer relationship with said edge portion, and two, mutually inwardly depending, tab portions spaced downwardly from said contact surface and resiliently freely abuttably engageable with a said side surface.

18. The floor module of claim 15 in which:

said frame is configured for supporting two adjacently positioned said floor tiles having substantially square peripheries; and including a crossover support extending between oppositely disposed side panels and having an edge portion at the level of said panel edge portion and located to receive load from the mutually adjacently disposed downwardly depending peripheral bearing surfaces of said two floor tiles.

19. The floor module of claim 15 including an air circulation blower mounted within said frame and having an upstream air inlet and an air output positioned adjacent a selective said access opening.

20. The floor module of claim 19 including a cooling coil having a cooling capacity corresponding with said operational heat generation characteristics mounted within said frame.

21. The floor module of claim 15 including:

an uninterruptible power supply mounted within said frame, having a self-contained air circulation fan at one end, an air input opening at an opposite end adjacent to and in air transfer communication with a select said air transfer opening, and having an output capacity corresponding with said power consumption characteristic;

said floor tile is configured having an air exit opening therein; and said frame access openings are blocked to define a dedicated air circulation path extending from said select air transfer opening, through said uninterruptible power supply and out of said floor tile air exit opening.

22. The floor module of claim 15 including a power distribution network mounted within said frame, having circuit breaker protection with manually actuable circuit breaker switches at an end thereof positioned adjacent to be accessible through a said access opening.

23. A floor supported substructure assemblage for a computer system component having a given base peripheral configuration with a base region through which heat removing air may pass, said system component having given operational heat generation and power consumption characteristics, comprising:

a plurality of floor modules, each having a lower portion supported upon said floor and having side portions extending upwardly therefrom to support an elevated floor surface at a given height and defining a discrete chamber intermediate said lower portion and said elevated floor surface, said floor modules being arranged in a said assemblage of predetermined peripheral geometric shape including a linear side portion;

a said floor module having a said side portion forming said assemblage linear side portion and having a cooling coil mounted within the said discrete chamber thereof connectable with cooling fluid conduits, and located within an input air path extending to an air intake adjacent thereto;

a step assembly supported upon said floor, having a riser portion extending upwardly a step height less than said floor module given height to a step surface, and defining a step cavity therewithin, said assembly being positioned in abutting adjacency with said assemblage linear side portion;

said cooling fluid conduits being located within said step cavity and coupled with said cooling coil;

the said elevated floor surface of a said floor module supporting said computer system component and having an air outlet formed therein for providing air transfer communication with said base region;

a said floor module discrete chamber retaining an air circulation blower having an input for receiving air from said input air path and an air flow output; and an air flow path defined by at least one said discrete chamber extending from said blower air output to said air outlet.

24. The substructure assemblage of claim 23 including an environmental confinement enclosure positioned over said assemblage elevated floor surface, having side walls extending from said elevated floor surface to a top cover located above said computer system component, and having a normally closed access opening for accessing said computer system component.

25. The substructure assemblage of claim 23 in which:

said floor module lower portion bottom surface is rectangular and has a predetermined widthwise extent and a lengthwise extent substantially twice said widthwise extent;

including a crossover support extending between said side portions extending along said lengthwise extent; and said elevated floor surface is provided as two substantially square said rigid floor tiles.

26. The substructure assemblage of claim 25 in which:

said computer system component is movably supported upon spaced apart wheels mounted at said base region;

including a ramp assemblage comprising two ramps each formed of two ramp members foldably coupled together at a hinge connection, one end of a said ramp member being hingedly coupled with a bridging member extensible to and supportable upon a said floor tile at a location over said crossover support, each said ramp including a downwardly depending coupler configured for abuttable positioning over a said side portion, said ramps being positionable in spaced apart relationship corresponding with said spaced apart wheels for receiving said wheels and supporting said computer system component for movement on and off of said assemblage elevated floor surface.

* * * * *